United States Patent
Endoh et al.

(10) Patent No.: US 8,258,571 B2
(45) Date of Patent: Sep. 4, 2012

(54) MOS SEMICONDUCTOR MEMORY DEVICE HAVING CHARGE STORAGE REGION FORMED FROM STACK OF INSULATING FILMS

(75) Inventors: Tetsuo Endoh, Sendai (JP); Masayuki Kohno, Amagasaki (JP); Tatsuo Nishita, Amagasaki (JP); Minoru Honda, Amagasaki (JP); Toshio Nakanishi, Amagasaki (JP); Yoshihiro Hirota, Amagasaki (JP)

(73) Assignees: Tokyo Electron Limited, Tokyo (JP); Tohoku University, Sendai-shi (JP)

( * ) Notice: Subject to any disclaimer, the term of this patent is extended or adjusted under 35 U.S.C. 154(b) by 208 days.

(21) Appl. No.: 12/665,534

(22) PCT Filed: Jun. 20, 2008

(86) PCT No.: PCT/JP2008/061679
§ 371 (c)(1),
(2), (4) Date: Mar. 11, 2010

(87) PCT Pub. No.: WO2008/156215
PCT Pub. Date: Dec. 24, 2008

(65) Prior Publication Data
US 2010/0283097 A1    Nov. 11, 2010

(30) Foreign Application Priority Data

Jun. 21, 2007  (JP) .................................. 2007-164371
Mar. 31, 2008  (JP) .................................. 2008-092420

(51) Int. Cl.
*H01L 29/792*    (2006.01)

(52) U.S. Cl. .. 257/324; 257/325; 257/411; 257/E29.309
(58) Field of Classification Search .................. 257/325
See application file for complete search history.

(56) References Cited

U.S. PATENT DOCUMENTS

| 6,906,390 B2 | 6/2005 | Nomoto et al. |
| 7,259,433 B2 | 8/2007 | Nomoto et al. |
| 2003/0030100 A1* | 2/2003 | Lee et al. ....................... 257/315 |
| 2003/0122204 A1 | 7/2003 | Nomoto et al. |
| 2006/0197141 A1* | 9/2006 | Ufert et al. ..................... 257/315 |
| 2008/0012065 A1* | 1/2008 | Kumar ........................... 257/324 |

FOREIGN PATENT DOCUMENTS

| JP | 11 40682 | 2/1999 |
| JP | 2002 203917 | 7/2002 |
| JP | 2006 324351 | 11/2006 |
| WO | WO 2009/123331 A1 * | 10/2009 |

* cited by examiner

Primary Examiner — Stephen W Smoot
(74) *Attorney, Agent, or Firm* — Oblon, Spivak, McClelland, Maier & Neustadt, L.L.P.

(57) ABSTRACT

The invention provides a MOS semiconductor memory device that achieves excellent data retention characteristics while also achieving high-speed data write performance, low-power operation performance, and high reliability. A MOS semiconductor memory device 601 includes a first insulating film 111 and fifth insulating film 115 having large bandgaps 111a and 115a, a third insulating film 113 having the smallest bandgap 113a, and a second insulating film 112 and fourth insulating film 114 interposed between the third insulating film 113 and the first and fifth insulating films 111 and 115, respectively, and having intermediate bandgaps 112a and 114a.

19 Claims, 24 Drawing Sheets

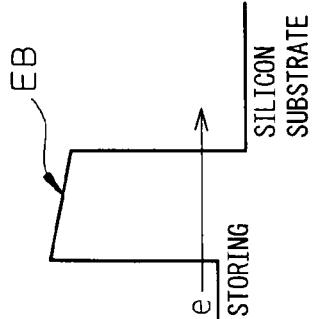
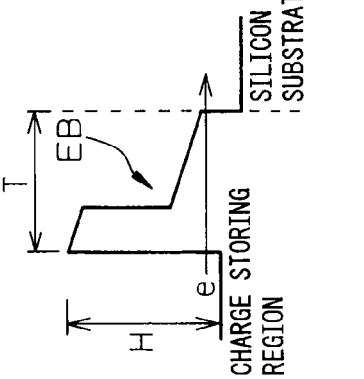
FIG.14(a)  FIG.14(b)  FIG.14(c)
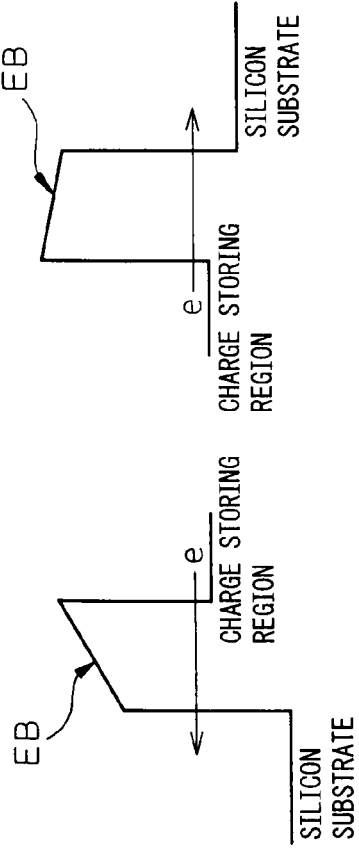
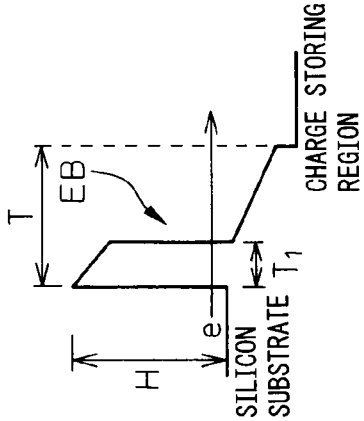
FIG.14(d)  FIG.14(e)  FIG.14(f)

MOS SEMICONDUCTOR MEMORY DEVICE HAVING CHARGE STORAGE REGION FORMED FROM STACK OF INSULATING FILMS

FIELD

The present invention relates to a MOS (Metal-Oxide-Silicon) semiconductor memory device, and more particularly to a MOS semiconductor memory device that includes, between a substrate and an electrode layer, a plurality of insulating films having different bandgap sizes.

BACKGROUND

EEPROM (Electrically Erasable and Programmable ROM) which can be erased electrically is one of various types of semiconductor memory device currently known in the art. This type of device is fabricated by first forming a silicon oxide film on a semiconductor substrate, then forming one or more silicon nitride films thereon, followed by the formation of a silicon oxide film, and finally forming a control gate electrode on the thus layered structure (for example, Japanese Unexamined Patent Publication No. 2002-203917 (U.S. Pat. Nos. 6,906,390 and 7,259,433), hereinafter referred to as patent document 1). In EEPROM, data "1" or "0" is written by applying a voltage between the semiconductor substrate and the control gate electrode and by storing electrons or holes primarily in the silicon nitride film or at the interface between the silicon nitride film and the upper or lower silicon oxide film in the layered structure of the insulating films (the insulating film stack structure).

The prior art will be described below by taking as an example a case where electrons are injected into the insulating film stack structure, which acts as the charge storing region. First, 0 V is applied to the semiconductor substrate, and a positive voltage, for example, 10 V, is applied to the control gate electrode. This means that a strong electric field is applied across the insulating film stack structure sandwiched between the semiconductor substrate and the control gate electrode, and electrons are injected from the semiconductor substrate into the silicon nitride film via the lower silicon oxide film by the tunnel effect. The injected electrons are trapped primarily in the silicon nitride film at or near the interface between the silicon nitride film and the lower silicon oxide film or upper silicon oxide film, and are stored as data.

An important factor for determining the performance of a nonvolatile semiconductor memory device such as EEPROM is the data retention. In the prior art regarding an MOS semiconductor memory device, if the electrons trapped in the silicon nitride film at or near the interface between the silicon nitride film and the lower silicon oxide film or upper silicon oxide film are to be retained stably over a long period of time, the thicknesses of the upper and lower silicon oxide films have had to be increased. However, there has been a problem that if the thicknesses of the upper and lower silicon oxide films are increased, the electric field applied across the insulating film stack structure to write data becomes weaker, slowing the data writing speed.

The above problem could be solved by increasing the electric field applied across the insulating film stack structure, but this would require increasing the data write voltage. However, not only the power consumption of the semiconductor memory device but the probability of the dielectric breakdown of the insulting films would also increase, resulting in the reliability of the semiconductor memory device greatly dropping.

SUMMARY

Problem to be Solved by the Invention

As described above, the prior art MOS semiconductor memory device has had the problem that if the data retention characteristics are to be improved, the data writing speed has to be compromised and, if the data writing speed is to be increased, not only the power consumption but also dielectric breakdown increases, leading to degradation of the reliability of the semiconductor memory device.

The present invention has been devised in view of the above situation, and it is an object of the invention to provide a MOS semiconductor memory device that achieves excellent data retention characteristics while also achieving high-speed data write performance, low-power operation performance, and high reliability.

Means for Solving the Problem

According to the present invention, there is provided a MOS semiconductor memory device which includes, between a semiconductor layer and a gate electrode, an insulating film stack structure as a charge storing region that is constructed by stacking a plurality of insulating films one on top of another.

Of the insulating films constituting the insulating film stack structure in the MOS semiconductor memory device of the present invention, a lower insulating film formed closest to the semiconductor layer and an upper insulating film formed closest to the gate electrode each have a larger bandgap than any of two or more insulating films interposed therebetween.

Preferably, in the MOS semiconductor memory device of the present invention, the insulating film stack structure includes, between the lower and the upper insulating film, a second insulating film having a smaller bandgap than the lower insulating film, a third insulating film having a larger bandgap than the second insulating film, and a fourth insulating film having a smaller bandgap than the third insulating film.

Alternatively, in the MOS semiconductor memory device of the present invention, the insulating film stack structure may include, between the lower and the upper insulating film, a second insulating film having a smaller bandgap than the lower insulating film, a third insulating film having a smaller bandgap than the second insulating film, and a fourth insulating film having a larger bandgap than the third insulating film.

Preferably, in the MOS semiconductor memory device of the present invention, the insulating film stack structure is constructed by repeatedly forming, between the lower and the upper insulating film, an intermediate stack structure comprising the second, third, and fourth insulating films.

Preferably, in the MOS semiconductor memory device of the present invention, the lower insulating film is formed in contact with the semiconductor layer; alternatively, the lower insulating film may be provided on the semiconductor layer by interposing therebetween a fifth insulating film formed in contact with the semiconductor layer and a second gate electrode layer formed in contact with the fifth insulating film.

Preferably, in the MOS semiconductor memory device of the present invention, the lower and upper insulating films are each a silicon oxide film, and the second, third, and fourth insulating films are each a silicon nitride film, a silicon nitride-oxide film, or a metal oxide film.

Preferably, in the MOS semiconductor memory device of the present invention, the third insulating film has an energy band structure such that, when viewed in a film thickness direction moving away from the semiconductor layer and toward the gate electrode, the bandgap of the third insulating film is small at or near the interface with the second insulating film and at or near the interface with the fourth insulating film and increases toward the center of the third insulating film. In this case, the third insulating film is a silicon nitride-oxide film and has an oxygen concentration profile such that, when viewed in the film thickness direction moving away from the semiconductor layer and toward the gate electrode, the proportion of oxygen to nitrogen in the third insulating film is small at or near the interface with the second insulating film and at or near the interface with the fourth insulating film and increases toward the center of the third insulating film.

Alternatively, the third insulating film may have an energy band structure such that, when viewed in the film thickness direction moving away from the semiconductor layer and toward the gate electrode, the bandgap of the third insulating film is large at or near the interface with the second insulating film and at or near the interface with the fourth insulating film and decreases toward the center of the third insulating film. In this case, the third insulating film is a silicon nitride film and has a nitrogen concentration profile such that, when viewed in the film thickness direction moving away from the semiconductor layer and toward the gate electrode, the proportion of nitrogen to silicon in the third insulating film is small at or near the interface with the second insulating film and at or near the interface with the fourth insulating film and increases toward the center of the third insulating film.

Preferably, in the MOS semiconductor memory device of the present invention, the second and fourth insulating film each have a thickness smaller than the thickness of the third insulating film.

Preferably, in the MOS semiconductor memory device of the present invention, the lower and the upper insulating film each have a thickness not smaller than 0.5 nm but not larger than 20 nm.

Preferably, in the MOS semiconductor memory device of the present invention, electron potential energy in a conduction band of the semiconductor layer is higher than electron potential energy in a conduction band of the second insulating film at the time of data writing but is lower at the time of data reading as well as during data retention.

Preferably, in the MOS semiconductor memory device of the present invention, the semiconductor layer is a pillar-like silicon layer, and a vertical stack structure comprising the insulating film stack structure and the gate electrode is disposed laterally to the pillar-like silicon layer.

According to the present invention, there is also provided a NAND memory cell array comprising a plurality of memory cells arranged in series, each memory cell being constructed from the MOS semiconductor memory device described above.

According to the present invention, there is also provided a NOR memory cell array comprising a plurality of memory cells arranged in parallel, each memory cell being constructed from the MOS semiconductor memory device described above.

Effect of the Invention

In the MOS semiconductor memory device of the present invention, of the insulating films constituting the insulating film stack structure interposed between the semiconductor layer and the gate electrode, the lower insulating film located closest to the semiconductor layer and the upper insulating film located closest to the gate electrode each have a larger bandgap than any one of the insulating films interposed therebetween. Accordingly, the charge injection from the semiconductor layer into the insulating film stack structure can easily occur by the tunnel effect. As a result, at the time of data writing, quick writing can be accomplished, without decreasing the probability of tunneling. Furthermore, since the voltage necessary for writing can be reduced, the generation of electron-hole pairs, due to impact ionization during application of the voltage, can be suppressed, reducing the probability of dielectric breakdown. In this way, since there is no need to apply a high voltage for data writing, write operations can be performed with low power consumption, and high reliability can be achieved.

On the other hand, the energy band structure characterized in that the lower insulating film located closest to the semiconductor layer and the upper insulating film located closest to the gate electrode have large bandgaps serves to prevent the charge stored therebetween from escaping. Accordingly, excellent data retention characteristics can be obtained without having to increase the thicknesses of these insulating films, one located closest to the semiconductor layer and the other closest to the gate electrode.

Thus, the MOS semiconductor memory device according to the present invention achieves excellent data retention characteristics while also achieving high-speed data write performance, low-power operation performance, and high reliability.

BRIEF DESCRIPTION OF THE DRAWINGS

FIG. 14(a) is a diagram showing one example of an energy diagram in the prior art.

FIG. 14(b) is a diagram showing one example of an energy diagram in the prior art.

FIG. 14(c) is a diagram showing one example of an energy diagram in the prior art.

FIG. 14(d) is a diagram showing one example of an energy diagram in the present invention.

FIG. 14(e) is a diagram showing one example of an energy diagram in the present invention.

FIG. 14(f) is a diagram showing one example of an energy diagram in the present invention.

DESCRIPTION OF EMBODIMENTS

Embodiment 1

Figure 1:
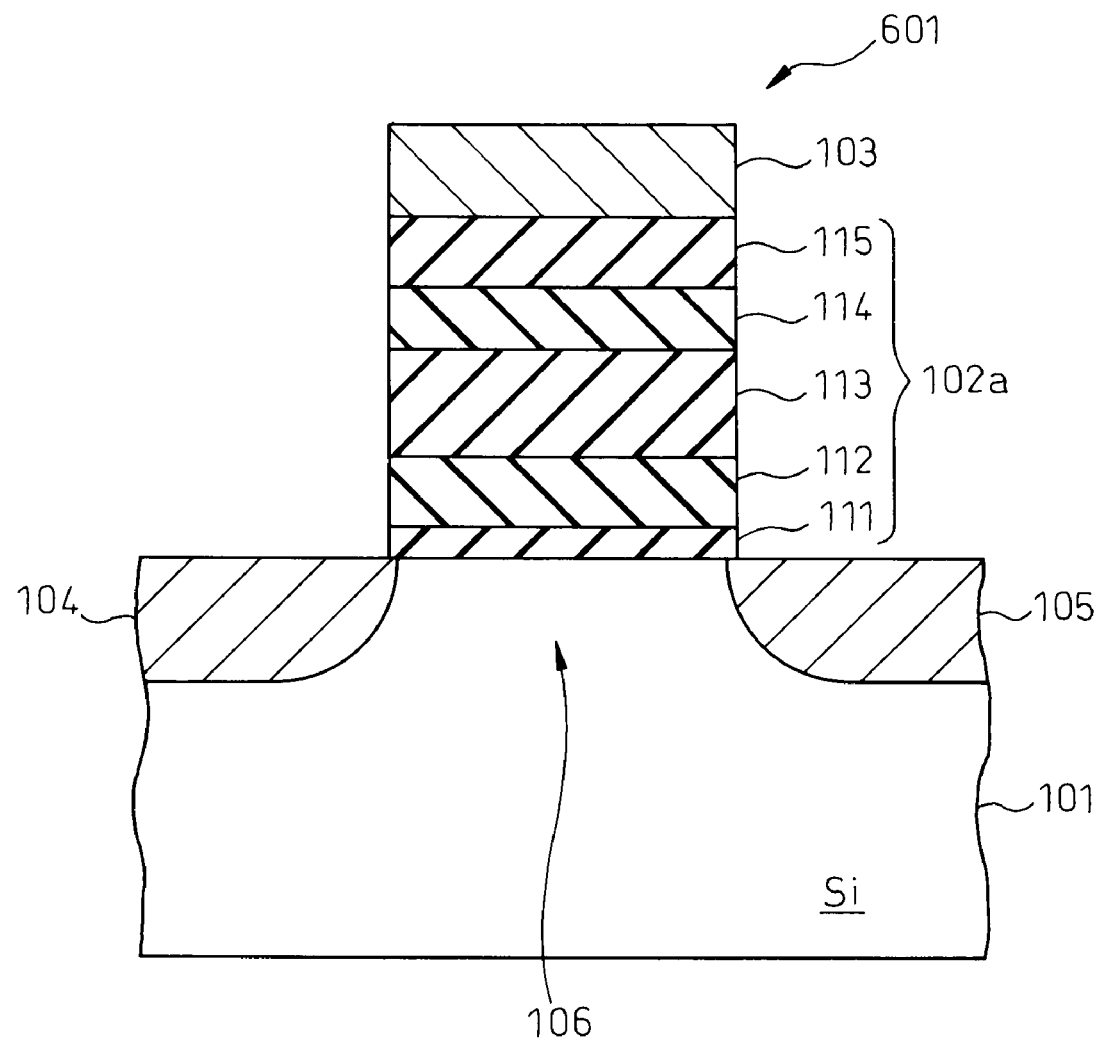
FIG. 1 is an explanatory diagram schematically showing the structure of a MOS semiconductor memory device according to a first embodiment of the present invention.
Figure 2:
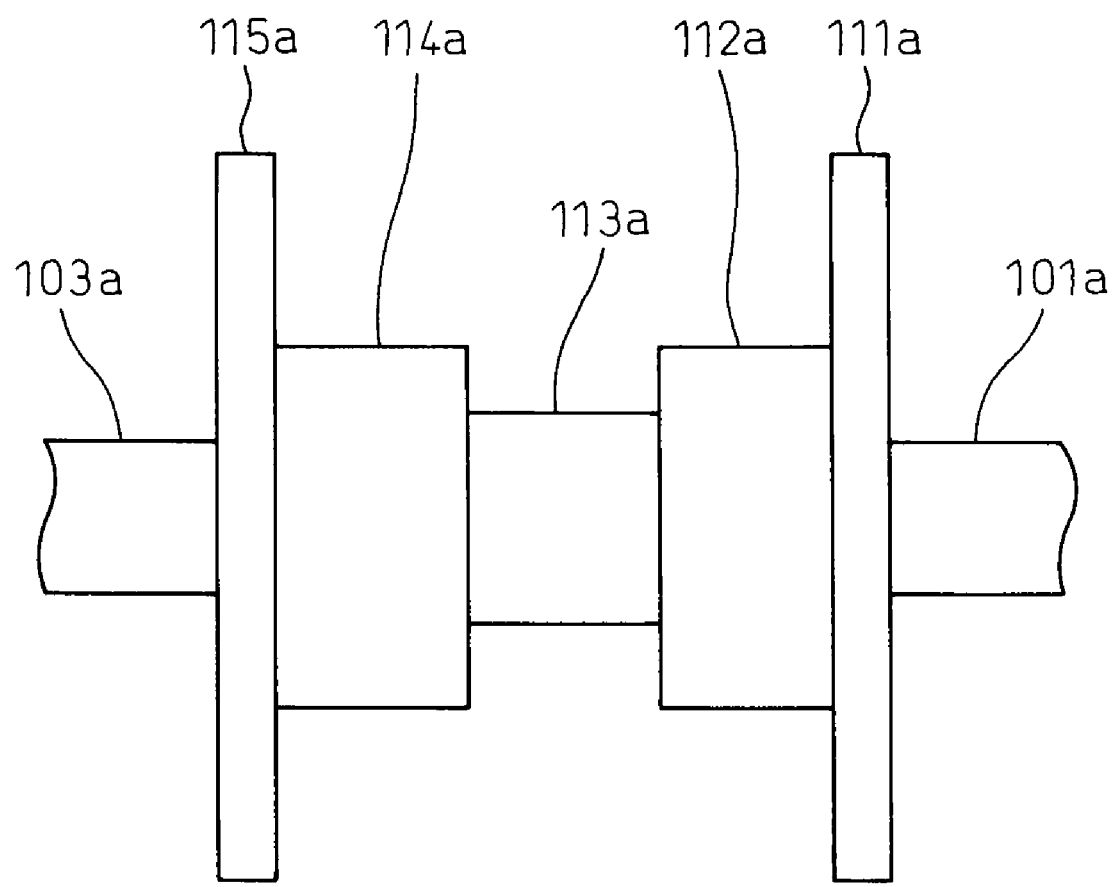
FIG. 2 is an energy band diagram of the MOS semiconductor memory device of FIG. 1.

Embodiments of the present invention will be described in detail below with reference to the drawings. FIG. 1 is a diagram schematically showing the structure of a MOS semiconductor memory device according to a first embodiment of the present invention. FIG. 2 is an energy band diagram of the MOS semiconductor memory device 601 of FIG. 1.

As shown in FIG. 1, the MOS semiconductor memory device 601 of this embodiment includes a p-type silicon substrate 101 as a semiconductor layer, an insulating film stack structure 102a constructed from a plurality of insulating films formed one on top of another on the p-type silicon substrate 101 and having different bandgap sizes, and a gate electrode 103 formed on top of the insulating film stack structure 102a. The insulating film stack structure 102a, which comprises a first insulating film 111, a second insulating film 112, a third insulating film 113, a fourth insulating film 114, and a fifth insulating film 115, is interposed between the silicon substrate 101 and the gate electrode 103. In the surface of the silicon substrate 101, a first source/drain 104 and a second source/drain 105 as n-type diffusion layers are formed to a prescribed depth so as to be disposed on both sides of the gate electrode 103; the region between the source/drain 104 and source/drain 105 is a channel forming region 106. The MOS semiconductor memory device 601 may be formed on a p-well or a p-type silicon layer formed in a semiconductor substrate. While the present embodiment will be described by taking an n-channel MOS device as an example, it will be appreciated that the memory device may be implemented as a p-channel MOS device. Accordingly, the following descriptions of the present embodiment are all applicable not only to an n-channel MOS device but also to a p-channel MOS device.

The first insulating film 111 is a silicon dioxide film ($SiO_2$ film) formed, for example, by thermally oxidizing the surface of the silicon substrate 101. The first insulating film 111 has an energy bandgap, for example, in the range of 8 to 10 eV. Preferably, the thickness of the first insulating film 111 is, for example, in the range of 0.5 nm to 20 nm, more preferably in the range of 1 nm to 10 nm, and desirably in the range of 1 nm to 3 nm.

The second insulating film 112 is a silicon nitride-oxide film (SiON film) formed on the surface of the first insulating film 111 (here, the composition ratio between Si, O, and N is not necessarily determined stoichiometrically, but takes different values depending on the film deposition conditions—the same applies hereinafter). The second insulating film 112 has an energy bandgap, for example, in the range of 5 to 7 eV. Preferably, the thickness of the second insulating film 112 is, for example, in the range of 2 nm to 20 nm, more preferably in the range of 2 nm to 10 nm, and desirably in the range of 3 nm to 5 nm.

The third insulating film 113 is a silicon nitride film (SiN film) formed on the second insulating film 112 (here, the composition ratio between Si and N is not necessarily determined stoichiometrically, but takes different values depending on the film deposition conditions—the same applies hereinafter). The third insulating film 113 has an energy bandgap, for example, in the range of 2.5 to 4 eV. Preferably, the thickness of the third insulating film 113 is, for example, in the range of 2 nm to 30 nm, more preferably in the range of 2 nm to 15 nm, and desirably in the range of 4 nm to 10 nm.

The fourth insulating film 114 is a silicon nitride-oxide film (SiON film) formed on the third insulating film 113. The fourth insulating film 114 has the same energy bandgap and the same thickness as those of the second insulating film 112.

The fifth insulating film 115 is a silicon dioxide film ($SiO_2$ film) deposited on the fourth insulating film 114, for example, by CVD (Chemical Vapor Deposition). The fifth insulating film 115 acts as a block layer (barrier layer) between the electrode 103 and the fourth insulating film 114. The fifth insulating film 115 has an energy bandgap, for example, in the range of 8 to 10 eV. Preferably, the thickness of the fifth insulating film 115 is, for example, in the range of 2 nm to 30 nm, more preferably in the range of 2 nm to 15 nm, and desirably in the range of 5 nm to 8 nm.

The gate electrode 103 is formed from a polycrystalline silicon film deposited, for example, by CVD, and acts as a control gate (CG) electrode. Alternatively, the gate electrode 103 may be formed from a film containing a metal such as W, Ti, Ta, Cu, Al, Au, Pt, or the like. The gate electrode 103 is not limited to a single layer structure, but may be formed in a multilayer structure containing, for example, tungsten, molybdenum, tantalum, titanium, platinum, or their silicides, nitrides, or alloys, in order to reduce the resistivity of the gate electrode 103 and speed up the operation. The gate electrode 103 is connected to an interconnection layer not shown.

In the MOS semiconductor memory device 601 of the present embodiment, it is preferable to use silicon nitride-oxide (SiON) or silicon dioxide ($SiO_2$) as the material for the first and fifth insulating films 111 and 115. Further, the materials for the second, third, and fourth insulating films 112, 113, and 114 are not limited to silicon nitride or silicon nitride-oxide, but insulating materials such as metal oxides may be used. Examples of such metal oxides include $HfO_2$, Hf—Si—O, Hf—Al—O, $ZrO_2$, $Al_2O_3$, PZT [$Pb(Zr,Ti)O_3$] (lead zirconate titanate), BST [$(Ba,Sr)TiO_3$], SRO ($SrRuO_3$), SBT ($SrBi_2Ta_2O_9$) (strontium bismuth tantalate), $Ta_2O_5$ (tantalum pentoxide), $BaTiO_3$ (barium titanate), $TiO_2$, YSZ (yttria stabilized zirconia), BIT ($Bi_4Ti_3O_{12}$), STO ($SrTiO_3$), zirconium silicon composite oxide, $La_2O_3$, $CeO_2$, $Na_2O_3$, $Sm_2O_3$, $Eu_2O_3$, $Gd_2O_3$, $M_2O_3$, $Dy_2O_3$, $Ho_2O_3$, $Tm_2O_3$, $Yb_2O_3$, $Lu_2O_3$, $La_2O_3$, $Pr_2O_3$, $Pr_6O_{11}$, and ZrON (zirconium oxynitride).

As shown in FIG. 2, the MOS semiconductor memory device 601 has an energy band structure such that the bandgaps 111a and 115a of the first and fifth insulating films 111 and 115 are larger than the bandgaps 112a, 113a, and 114a of the second, third, and fourth insulating films 112, 113, and 114 forming an intermediate stack structure interposed between the first and fifth insulating films 111. The first and fifth insulating films 111 and 115 are separated from the third insulating film 113 having the smallest bandgap by respectively interposing therebetween the second and fourth insulating films 112 and 114 having the intermediate bandgaps 112a and 114a. In FIG. 2, reference numeral 101a designates the bandgap of the silicon substrate 101, and reference numeral 103a designates the bandgap of the gate electrode 103 (the same designations are used in FIGS. 5, 7, 9, 11, and 12). Such an energy band structure allows the charge to move easily across the first insulating film 111 at the time of data writing, and serves to enhance the writing speed and to reduce the write voltage necessary to inject the charge into the insulating film stack structure 102a. In the present embodiment, the bandgap size of each of the first to fifth insulating films 111 to 115 can be controlled by varying the elements forming the film and their composition ratio.

In order to enhance the write speed, it is preferable to set the thickness of each of the second and fourth insulating films 112 and 114 smaller than the thickness of the third insulating film 113 so that a phenomenon called coulomb blockade occurs at the time of writing. Further, from the viewpoint of increasing the probability of occurrence of the tunnel effect such as FN (Fowler-Nordheim) tunneling to further enhance the write speed, it is preferable to set up the structure so that, at the time of writing, the electron potential energy in the conduction band of the silicon substrate 101 becomes higher than the electron potential energy in the conduction band of the second insulating film 112. Further, in order to improve the data retention characteristics, it is preferable to set up the structure so that, during data retention, the electron potential energy in the conduction band of the silicon substrate 101 is held lower than the electron potential energy in the conduction band of the second insulating film 112. Furthermore, it is preferable to set up the structure so that, at the time of data reading, the electron potential energy in the conduction band of the silicon substrate 101 becomes lower than the electron potential energy in the conduction band of the second insulating film 112, as in the case of data retention.

In the insulating film stack structure 102a, the charge tends to be stored primarily in the region centered around the third insulating film 113 having the smallest bandgap. On the other hand, once the charge is stored in the region centered around the third insulating film 113, energy barriers become greater because of the presence of the second and fourth insulating films 112 and 114 adjacent to it, preventing the charge from escaping through the first or fifth insulating film 111 or 115. Accordingly, the charge can be retained stably within the insulating film stack structure 102a without having to increase the thicknesses of the first and fifth insulating films 111 and 115, and excellent data retention characteristics can thus be obtained.

An example of the operation of the MOS semiconductor memory device 601 having the above structure will be described below. First, when writing data, the first source/drain 104 and the second source/drain 105 are held at 0 V relative to the potential of the silicon substrate 101, and a prescribed positive voltage is applied to the gate electrode 103. At this time, electrons are stored in the channel forming region 106, forming an inverted layer, and part of the charge in the inverted layer moves through the first insulating film 111 into the insulating film stack structure 102a by virtue of the tunnel effect. The electrons that moved into the insulating film stack structure 102a are trapped in the charge trapping centers formed therein, and the data is thus stored.

On the other hand, when reading data, either one of the first source/drain 104 and second source/drain 105 is held at 0 V relative to the potential of the silicon substrate 101, and a prescribed voltage is applied to the other one. The prescribed voltage is also applied to the gate electrode 103. When the voltage is applied in this way, the amount of channel current or the drain voltage changes according to the presence or absence of charge stored in the insulating film stack structure 102a or the amount of stored charge. The stored data can therefore be read out by detecting the change in the channel current or the drain voltage.

When erasing data, the first source/drain 104 and the second source/drain 105 are both held at 0 V relative to the potential of the silicon substrate 101, and a negative voltage of prescribed magnitude is applied to the gate electrode 103. With the voltage thus applied, the charge retained in the insulating film stack structure 102a is drawn into the channel forming region 106 of the silicon substrate 101 via the first insulating film 111. The MOS semiconductor memory device 601 thus changes back to the erased state where the amount of stored charge is low.

The information read, write, and erasure method of the MOS semiconductor memory device 601 is not limited to the above method, but the read, write, and erasure operations may be performed using other suitable methods. For example, information read, write, and erasure can be performed by utilizing various physical phenomena such as FN tunneling, hot electron injection, hot hole injection, electro-optical effect, etc. Furthermore, provisions may be made to be able to write and read two or more bits of information to and from each memory cell by not fixing the functions of the first source/drain 104 and second source/drain 105 but by making them function as the source and drain in turn.

As described above, compared with the prior art MOS semiconductor memory device, the MOS semiconductor memory device 601 according to the present embodiment achieves excellent data retention characteristics while also achieving high-speed data writing, low-power operation, and high reliability.

The MOS semiconductor memory device 601 according to the present embodiment can be fabricated using a known method. A description will be given by taking one example of a typical procedure. First, a device isolation film is formed on the silicon substrate 101 using a known technique such as LOCOS (Local Oxidation of Silicon) or STI (Shallow Trench Isolation). Next, the first insulating film 111 is formed on the surface of the silicon substrate 101, for example, by thermal oxidation.

Next, the second insulating film 112, the third insulating film 113, and the fourth insulating film 114 are sequentially formed on top of the first insulating film 111. The silicon nitride film as the third insulating film 113 can be formed, for example, by CVD. The silicon nitride-oxide film or metal oxide film as the second or fourth insulating film 112 or 114 may be directly formed, for example, by CVD, or may be formed by first forming a silicon nitride film by CVD and then oxidizing it or by first forming a silicon oxide film by CVD and then nitriding it.

Next, the fifth insulating film 115 is formed on the fourth insulating film 114. The fifth insulating film 115 can be formed, for example, by CVD. Further, a metal film for forming the gate electrode 103 is formed on top of the fifth insulating film 115 by depositing a polysilicon layer, metal layer, or metal silicide or like layer, for example, by CVD.

Subsequently, the metal film and the fifth to first insulating films 115 to 111 are etched by photolithography using a patterned resist as a mask, to complete the fabrication of a gate stacked structure comprising the patterned gate electrode 103 and insulating film stack structure 102a as shown in FIG. 1. Next, n-type impurities are ion-implanted at high concentrations into the silicon surface regions adjacent to both sides of the gate stacked structure, to form the first source/drain 104 and the second source/drain 105, respectively. The MOS semiconductor memory device 601 of the structure shown in FIG. 1 can be fabricated in this way.

In the present embodiment, the method for forming the silicon oxide film, silicon nitride film, and silicon nitride-oxide film for use as the first to fifth insulating films 111 to 115 is not specifically limited, but any suitable method, such as thermal oxidation, CVD, ALD (Atomic Layer Deposition), or nitriding or oxidation using atomic diffusion, may be appropriately chosen. For example, the silicon oxide film may be formed by oxidizing a silicon film using a method such as plasma oxidation, and the silicon nitride film may be formed by nitriding a silicon film using a method such as plasma nitriding. Further, the silicon nitride-oxide film may be formed, for example, by first forming a silicon dioxide film by CVD and then nitriding it using a method such as plasma nitriding, or by first forming a silicon nitride film by CVD and then oxidizing it using a method such as plasma oxidation. The first to fifth insulating films 111 to 115 can be formed by appropriately combining these methods.

In the present embodiment, it is preferable that the second, third, and fourth insulating films 112, 113, and 114 that together serve a central role as the charge storing region are formed by plasma CVD using a plasma processing apparatus 100 to be described hereinafter. That is, it is preferable to form the silicon nitride film by plasma CVD using the plasma processing apparatus 100 or to form the silicon nitride-oxide film by oxidizing the thus obtained silicon nitride film.

Figure 3:
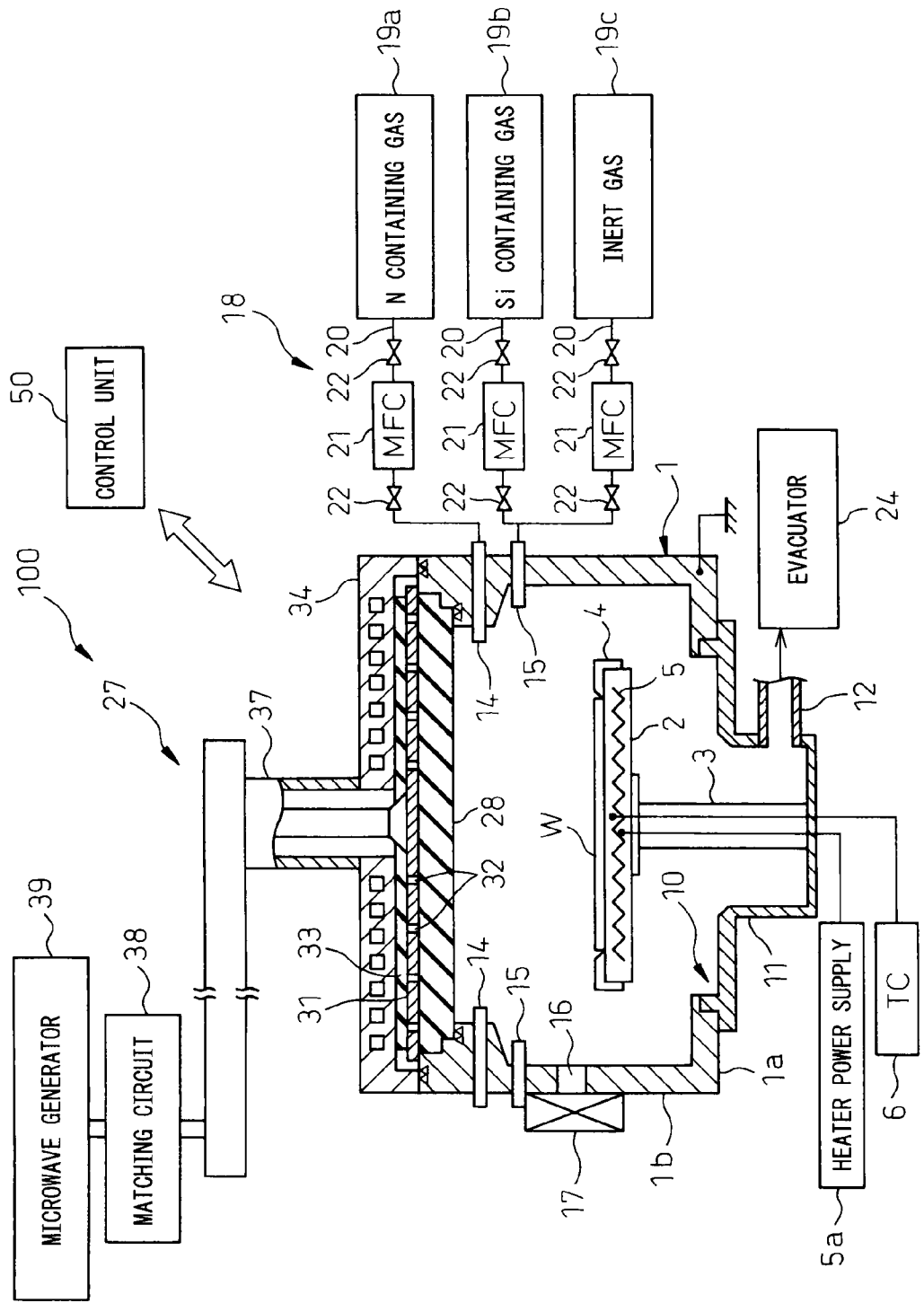
FIG. 3 is a schematic cross-sectional view showing one example of a plasma processing apparatus that is suitable for insulating film deposition.

A preferred example of a silicon nitride film deposition method used to form the second to fourth insulating films 112 to 114 constituting the insulating film stack structure 102a will be described below with reference to FIG. 3. FIG. 3 is a cross-sectional view schematically showing the construction of the plasma processing apparatus 100 that can be used for silicon nitride film deposition.

The plasma processing apparatus 100 is constructed as an RLSA (Radial Line Slot Antenna) microwave plasma processing apparatus that can generate a microwave-excited high density, low electron temperature plasma by introducing a microwave into a processing chamber by using a planar antenna having a plurality of slotted holes, in particular, a radial line slot antenna (RLSA). In the plasma processing apparatus 100, processing can be performed using a plasma having a plasma density of $1 \times 10^{10}$ to $5 \times 10^{12}/cm^3$ and a low electron temperature of 0.7 to 2 eV. Accordingly, the plasma processing apparatus 100 can be advantageously used in the fabrication process of various semiconductor devices to deposit silicon nitride films with minimum damage by plasma CVD.

The major components of the plasma processing apparatus 100 are: an airtight chamber (processing chamber) 1; a gas supply mechanism 18 for supplying gases into the chamber 1; an exhaust system (or device) 24 as an evacuating mechanism for partially evacuating the chamber 1; a microwave introducing mechanism 27, provided above the chamber 1, for introducing a microwave into the chamber 1; and a control unit 50 for controlling the various components of the plasma processing apparatus 100.

The chamber 1 is constructed from a substantially cylindrical-shaped grounded container. Alternatively, the chamber 1 may be constructed from a rectangular-shaped container. The chamber 1 has a bottom wall 1a and side wall 1b formed from aluminum or like material.

A susceptor 2 for horizontally holding a silicon wafer (hereinafter simply referred to as the "wafer") W to be processed is provided inside the chamber 1. The susceptor 2 is formed from a material having high thermal conductivity, for example, a ceramic such as AlN. The susceptor 2 is supported on a cylindrically shaped supporting member 3 extending upward from the center of the bottom of an exhaust chamber 11. The supporting member 3 is formed, for example, from a ceramic such as AlN.

Further, the susceptor 2 is provided with a covering 4 for covering the outer periphery thereof and for guiding the wafer W. The covering 4 is an annular member formed from a material such as quartz, An, Al2O3, SiN, or the like.

A resistive heater 5 as a temperature regulating mechanism is embedded in the susceptor 2. The heater 5 is fed from a heater power supply 5a and heats the susceptor 2 thereby uniformly heating the wafer W as the substrate to be processed.

A thermocouple (TC) 6 is connected to the susceptor 2. By measuring the temperature using the thermocouple 6, the heating temperature of the wafer W can be controlled over a temperature range, for example, from room temperature to 900° C.

The susceptor 2 is further provided with wafer support pins (not shown) for lifting and lowering the wafer W by supporting it thereon. Each wafer support pin is provided in such a manner that it can be made to protrude from and retract into the surface of the susceptor 2.

A circular opening 10 is formed in a substantially central portion of the bottom wall 1a of the chamber 1. The exhaust chamber 11 communicating with the opening 10 and protruding downward is mounted to the bottom wall 1a. An exhaust pipe 12 is attached to the exhaust chamber 11 which is connected to the exhaust device 24 via this exhaust pipe 12.

An annular gas inlet member 14 is mounted in the upper end portion of the side wall 1b of the chamber 1. Another annular gas inlet member 15 is also mounted in the side wall 1b of the chamber 1. That is, the gas inlet members 14 and 15 are mounted one above the other. The gas inlet members 14 and 15 are connected to the gas supply mechanism 18 which supplies a source gas for film deposition and a gas for plasma excitation. Here, the gas inlet members 14 and 15 may be constructed to discharge the gases through nozzles or spray the gases like a shower.

The side wall 1b of the chamber 1 is also provided with a load/unload opening 16 through which the wafer W is loaded into the plasma processing apparatus 100 from a loading chamber (not shown) adjacent to it, and a gate valve 17 for opening and closing the load/unload opening 16.

The gas supply mechanism 18 includes, for example, a nitrogen-containing gas (N-containing gas) supply source 19a, a silicon-containing gas (Si-containing gas) supply source 19b, and an inert gas supply source 19c. The nitrogen-containing gas supply source 19a is connected to the upper gas inlet member 14. The silicon-containing gas supply source 19b and the inert gas supply source 19c are connected to the lower gas inlet member 15. The gas supply mechanism 18 may further include other gas supply sources (not shown) such as a cleaning gas supply source which is used when cleaning the interior of the chamber 1.

For the nitrogen-containing gas as a film deposition source gas, use may be made, for example, of nitrogen gas ($N_2$), ammonia ($NH_3$), or hydrazine derivatives such as MMH (monomethyl hydrazine). For the silicon-containing gas as another film deposition source gas, use may be made, for example, silane ($SiH_4$), disilane ($Si_2H_6$), trisilane ($Si_3H_8$), TSA (trisilylamine), or the like. Among them, disilane ($Si_2H_6$) is preferable. For the inert gas, use may be made, for example, an N2 gas or a rare gas. The rare gas is a plasma excitation gas, examples including Ar gas, Kr gas, Xe gas, He gas, etc., among which Ar gas is preferable from the viewpoint of industrial application.

The nitrogen-containing gas fed from the nitrogen-containing gas supply source 19a of the gas supply mechanism 18 flows through a gas line 20 and is introduced via the gas inlet member 14 into the chamber 1. On the other hand, the silicon-containing gas and the inert gas fed from the silicon-containing gas supply source 19b and the inert gas supply source 19c, respectively, flow through respective gas lines 20 and are introduced via the gas inlet member 15 into the chamber 1. Each gas line 20 is provided with a mass flow controller 21 and open/close valves 22 installed before and after it so that the selection of the gas to be supplied, the flow rate of the gas, etc., can be controlled.

The gases introduced into the chamber 1 are discharged outside through the exhaust pipe 12 by operating the exhaust device 24. The chamber 1 can thus be evacuated quickly to a predetermined vacuum level, for example, 0.133 Pa. The chamber 1 is provided with a pressure gauge (not shown) so that the pressure inside the chamber 1 can be measured.

The major components of the microwave introducing mechanism 27 are a transmission plate 28, a planar antenna member 31, a wave retarder 33, a shielding lid member 34, a waveguide 37, a matching circuit 38, and a microwave generator 39.

Next, a description will be given of how the silicon nitride film is deposited by CVD using the RLSA-type plasma processing apparatus 100. First, the gate valve 17 is opened, and the wafer W is loaded into the chamber 1 through the load/unload opening 16 and is mounted on the susceptor 2. Next, while evacuating the chamber 1, the nitrogen-containing gas and the silicon-containing gas, fed from the nitrogen-containing gas supply source 19a and the silicon-containing gas supply source 19b, respectively, are introduced, each at a predetermined flow rate, into the chamber 1 through the respective gas inlet members 14 and 15. The pressure inside the chamber 1 is thus adjusted to a predetermined pressure level.

Next, a microwave of a predetermined frequency, for example, 2.45 GHz, generated by the microwave generator 39, is introduced through microwave radiating slotted holes 32 opened through the planar antenna member 31 and is radiated from the transmission plate 28 into the space above the wafer W in the chamber 1. The microwave output at this time can be set, for example, in the range of about 500 to 3000 W (0.25 to 1.54 W/cm² of the transmission plate 28).

An electromagnetic field is formed within the chamber 1 by the microwave radiated from the planar antenna member 31 and the transmission plate 28 into the chamber 1, and the nitrogen-containing gas and the silicon-containing gas are thus converted to plasma form. Then, dissociation of the source gases proceeds in the plasma, and a thin film of silicon nitride SiN is deposited by reaction of active species such as $Si_pH_q$, $SiH_q$, $NH_q$, N, etc. (here, p and q are arbitrary numbers—the same applies hereinafter).

In the plasma processing apparatus 100, the trap density of the silicon nitride film can be controlled to a desired level by selecting the plasma CVD conditions when depositing the silicon nitride film. For example, if it is desired to increase the trap density in the silicon nitride film to be deposited (for example, to a trap density in the range of $5 \times 10^{12}$ to $1 \times 10^{13}$ $cm^{-2} eV^{-1}$), it is preferable to conduct the plasma CVD using the following conditions. An $NH_3$ gas is used as the nitrogen-containing gas, and a $Si_2H_6$ gas as the silicon-containing gas, and the flow rate of the $NH_3$ gas is set in the range of 10 to 5000 mL/min (sccm) and preferably in the range of 100 to 2000 mL/min (sccm), while the flow rate of the $Si_2H_6$ gas is set in the range of 0.5 to 100 mL/min (sccm) and preferably in the range of 1 to 50 mL/min (sccm). In this case, from the standpoint of forming a silicon nitride film having a high Si concentration, it is preferable to set the ratio of the flow rate of the $NH_3$ gas to that of the $Si_2H_6$ gas ($NH_3$ gas flow rate/$Si_2H_6$ gas flow rate) in the range of 0.1 to 2000, more preferably in the range of 0.1 to 1000, and desirably in the range of 5 to 50. Further, when using the above $NH_3$ gas and $Si_2H_6$ gas, it is preferable to set the processing pressure in the range of 1 to 1333 Pa, and more preferably in the range of 50 to 650 Pa, in order to form a silicon nitride film having a large trap density.

On the other hand, if it is desired, for example, to reduce the trap density in the silicon nitride film to be deposited (for example, to a trap density in the range of $5 \times 10^{10}$ to less than $5 \times 10^{12}$ $cm^{-2} eV^{-1}$), it is preferable to use an $N_2$ gas as the nitrogen-containing gas and a $Si_2H_6$ gas as the silicon-containing gas. More specifically, the flow rate of the $N_2$ gas is set in the range of 10 to 5000 mL/min (sccm) and preferably in the range of 100 to 2000 mL/min (sccm), while the flow rate of the $Si_2H_6$ gas is set in the range of 0.5 to 100 mL/min (sccm) and preferably in the range of 0.5 to 10 mL/min (sccm). In this case, from the standpoint of forming a silicon nitride film having a low Si concentration to a uniform thickness, it is preferable to set the ratio of the flow rate of the $N_2$ gas to that of the $Si_2H_6$ gas ($N_2$ gas flow rate/$Si_2H_6$ gas flow rate) in the range of 0.1 to 5000, and more preferably in the range of 100 to 4000. Further, when using the above $N_2$ gas and $Si_2H_6$ gas, it is preferable to set the processing pressure in the range of 0.1 to 500 Pa, and more preferably in the range of 1 to 100 Pa, in order to form a silicon nitride film having a small trap density.

If the plasma CVD is conducted by alternately using the plasma generated under the conditions for increasing the trap density and the plasma generated under the conditions for reducing the trap density, silicon nitride films having different trap densities can be deposited alternately one on top of another.

In either case, the processing temperature of the plasma CVD should be set so that the susceptor 2 is heated at a temperature in the range of 300° C. to 800° C. or higher, and preferably in the range of 400° C. to 600° C.

In this way, the silicon nitride films used to form the second to fourth insulating films 112 to 114 can be easily obtained. The silicon nitride-oxide film (SiON film) can be easily obtained by processing the thus obtained silicon nitride film, for example, by plasma oxidation or thermal oxidation. Further, when fabricating the MOS semiconductor memory device, if a plurality of film deposition apparatuses each including the plasma processing apparatus 100 are connected together via a vacuum without exposing them to the atmosphere, the intended films (silicon dioxide film, silicon nitride film, silicon nitride-oxide film, etc.) can be sequentially deposited in the respective film deposition apparatuses.

Embodiment 2

Figure 4:
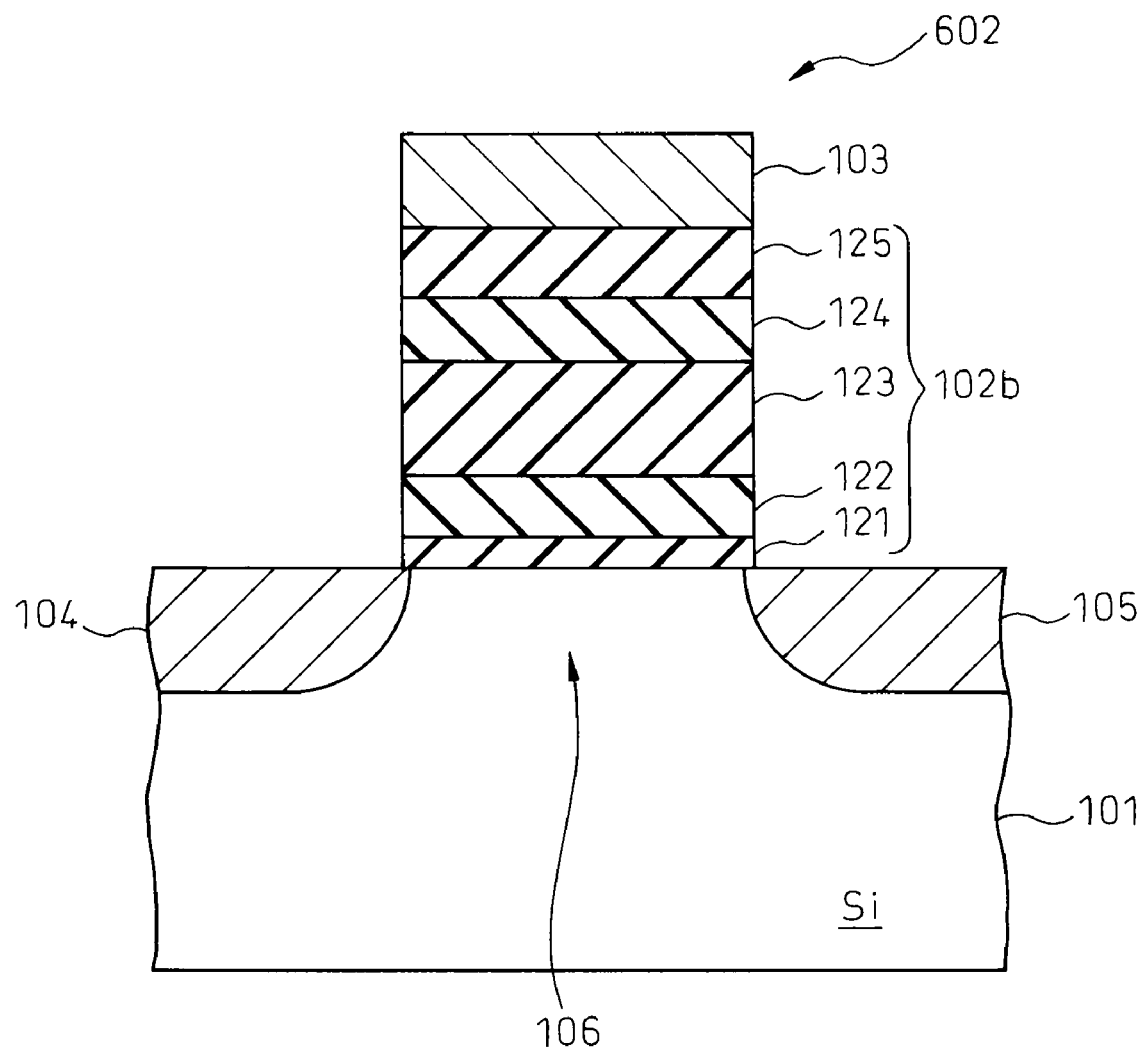
FIG. 4 is an explanatory diagram schematically showing the structure of a MOS semiconductor memory device according to a second embodiment of the present invention.
Figure 5:
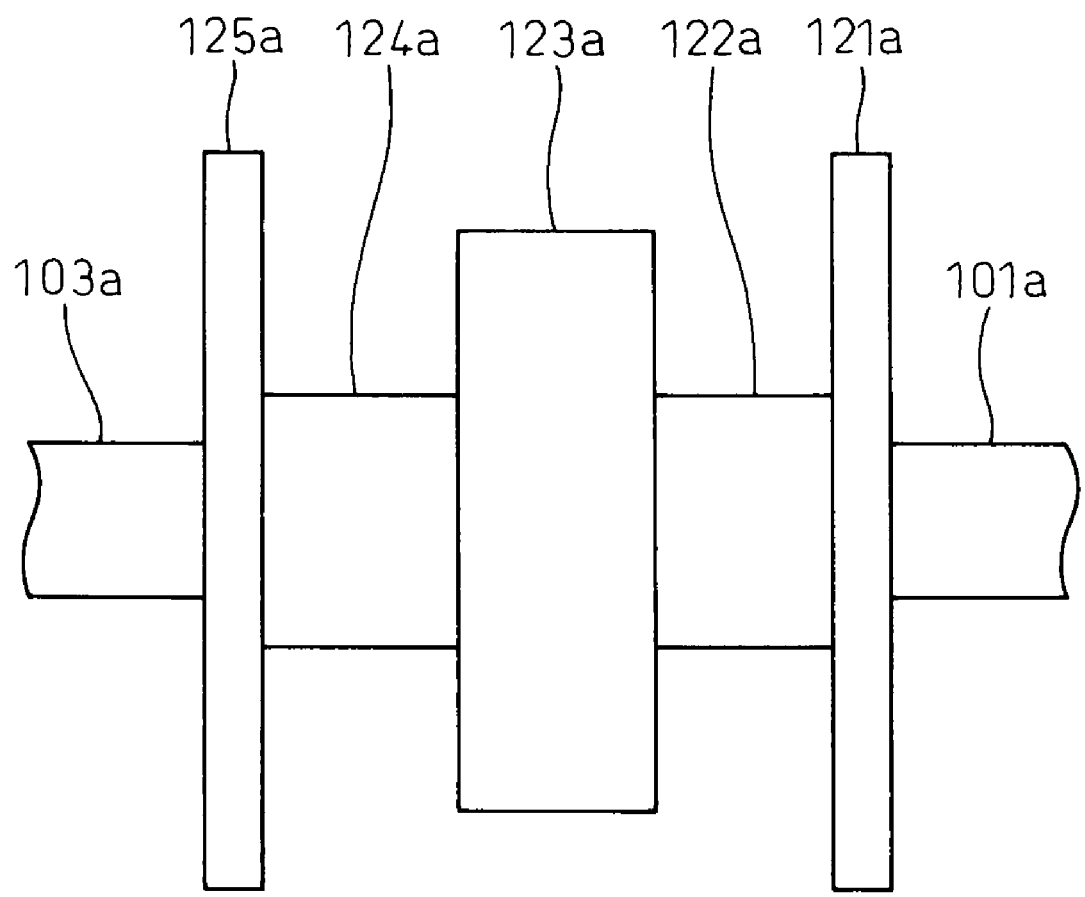
FIG. 5 is an energy band diagram of the MOS semiconductor memory device of FIG. 4.

FIG. 4 is a diagram schematically showing the structure of a MOS semiconductor memory device according to a second embodiment of the present invention. FIG. 5 is an energy band diagram of the MOS semiconductor memory device 602 of FIG. 4.

As shown in FIG. 4, the MOS semiconductor memory device 602 of this embodiment includes a p-type silicon substrate 101 as a semiconductor layer, an insulating film stack structure 102b constructed from a plurality of insulating films formed one on top of another on the p-type silicon substrate 101 and having different bandgap sizes, and a gate electrode 103 formed on top of the insulating film stack structure 102b. The insulating film stack structure 102b, which comprises a first insulating film 121, a second insulating film 122, a third insulating film 123, a fourth insulating film 124, and a fifth insulating film 125, is interposed between the silicon substrate 101 and the gate electrode 103. In the surface of the silicon substrate 101, a first source/drain 104 and a second source/drain 105 as n-type diffusion layers are formed to a prescribed depth so as to be disposed on both sides of the gate electrode 103; the region between the source/drain 104 and source/drain 105 is a channel forming region 106. The MOS semiconductor memory device 602 may be formed on a p-well or a p-type silicon layer formed in a semiconductor substrate. While the present embodiment will be described by taking an n-channel MOS device as an example, it will be appreciated that the memory device may be implemented as a p-channel MOS device. Accordingly, the following descriptions of the present embodiment are all applicable not only to an n-channel MOS device but also to a p-channel MOS device.

In the MOS semiconductor memory device 602 according to the present embodiment, the first insulating film 121, the fifth insulating film 125, and the gate electrode 103 are respectively identical in structure to the first insulating film 111, the fifth insulating film 115, and the gate electrode 103 in the semiconductor memory device 601 of the first embodiment shown in FIG. 1, and therefore, their descriptions will not be repeated here.

The second insulating film 122 is a silicon nitride film (SiN film) formed on the first insulating film 121. The second insulating film 122 has an energy bandgap, for example, in the range of 2.5 to 4 eV. Preferably, the thickness of the second insulating film 122 is, for example, in the range of 2 nm to 20 nm, more preferably in the range of 2 nm to 10 nm, and desirably in the range of 3 nm to 5 nm.

The third insulating film 123 is a silicon nitride-oxide film (SiON film) formed on the second insulating film 122. The third insulating film 123 has an energy bandgap, for example, in the range of 5 to 7 eV. Preferably, the thickness of the third insulating film 123 is, for example, in the range of 2 nm to 30 nm, more preferably in the range of 2 nm to 15 nm, and desirably in the range of 4 nm to 10 nm.

The fourth insulating film 124 is a silicon nitride film (SiN film) formed on the third insulating film 123. The fourth insulating film 124 has the same energy bandgap and the same thickness as those of the second insulating film 122.

In the present embodiment, to enhance the write speed, it is preferable to set the thickness of each of the second and fourth insulating films 122 and 124 smaller than the thickness of the third insulating film 123 so that a phenomenon called coulomb blockade occurs at the time of writing. Further, from the viewpoint of increasing the probability of occurrence of tunneling to further enhance the write speed, it is preferable to set up the structure so that the electron potential energy in the conduction band of the silicon substrate 101 becomes higher than the electron potential energy in the conduction band of the second insulating film 122. Further, in order to improve the data retention characteristics, it is preferable to set up the structure so that, during data retention, the electron potential energy in the conduction band of the silicon substrate 101 is held lower than the electron potential energy in the conduction band of the second insulating film 122. Furthermore, it is preferable to set up the structure so that, at the time of data reading, the electron potential energy in the conduction band of the silicon substrate 101 becomes lower than the electron potential energy in the conduction band of the second insulating film 122, as in the case of data retention.

The materials for the second, third, and fourth insulating films 122, 123, and 124 are not limited to silicon nitride or silicon nitride-oxide, but use may be made of insulating materials such as metal oxides. The same metal oxides as those listed as examples in the first embodiment can be used.

The method for forming the first to fifth insulating films 121 to 125 is not specifically limited but, as in the first embodiment, such methods as thermal oxidation, CVD, ALD, and nitriding or oxidation using atomic diffusion may be appropriately combined for use. In the present embodiment also, it is preferable that the second, third, and fourth insulating films 122, 123, and 124 that together serve a central role as the charge storing region are formed by plasma CVD using the plasma processing apparatus 100. That is, it is preferable to form the silicon nitride film by plasma CVD using the plasma processing apparatus 100 or to form the silicon nitride-oxide film by oxidizing the thus obtained silicon nitride film.

As shown in FIG. 5, the MOS semiconductor memory device 602 has an energy band structure such that the bandgaps 121a and 125a of the first and fifth insulating films 121 and 125 are larger than the bandgaps 122a, 123a, and 124a of the second, third, and fourth insulating films 122, 123, and 124 forming an intermediate stack structure interposed between the first and fifth insulating films 121 and 125. The first and fifth insulating films 121 and 125 are separated from the third insulating film 123 having the intermediate bandgap 123a by respectively interposing therebetween the second and fourth insulating films 122 and 124 each having the smallest bandgap. Such an energy band structure allows the charge to move easily by the tunnel effect across the first insulating film 121 at the time of data writing, and serves to enhance the writing speed and to reduce the write voltage necessary to inject the charge into the insulating film stack structure 102b. The bandgap size of each of the first to fifth insulating films 121 to 125 can be controlled by varying the elements forming the film and their composition ratio.

In the insulating film stack structure 102b, the charge tends to be stored primarily at or near the interfaces between the third insulating film 123 and the second and fourth insulating films 122 and 124 having the smaller bandgaps. On the other hand, once the charge is stored at or near these interfaces, energy barriers become greater because of the presence of the second and fourth insulating films 122 and 124, preventing the charge from escaping through the first or fifth insulating film 121 or 125. Accordingly, the charge can be retained stably within the insulating film stack structure 102b without having to increase the thicknesses of the first and fifth insulating films 121 and 125, and excellent data retention characteristics can thus be obtained.

Accordingly, compared with the prior art MOS semiconductor memory device, the MOS semiconductor memory device 602 achieves excellent data retention characteristics while also achieving high-speed data writing, low-power operation, and high reliability.

The read, write, and erasure operations of the MOS semiconductor memory device 602 according to the present embodiment can be performed in the same manner as in the first embodiment. Further, the MOS semiconductor memory device 602 can be fabricated using essentially the same process sequence as that described in the first embodiment.

Embodiment 3

Figure 6:
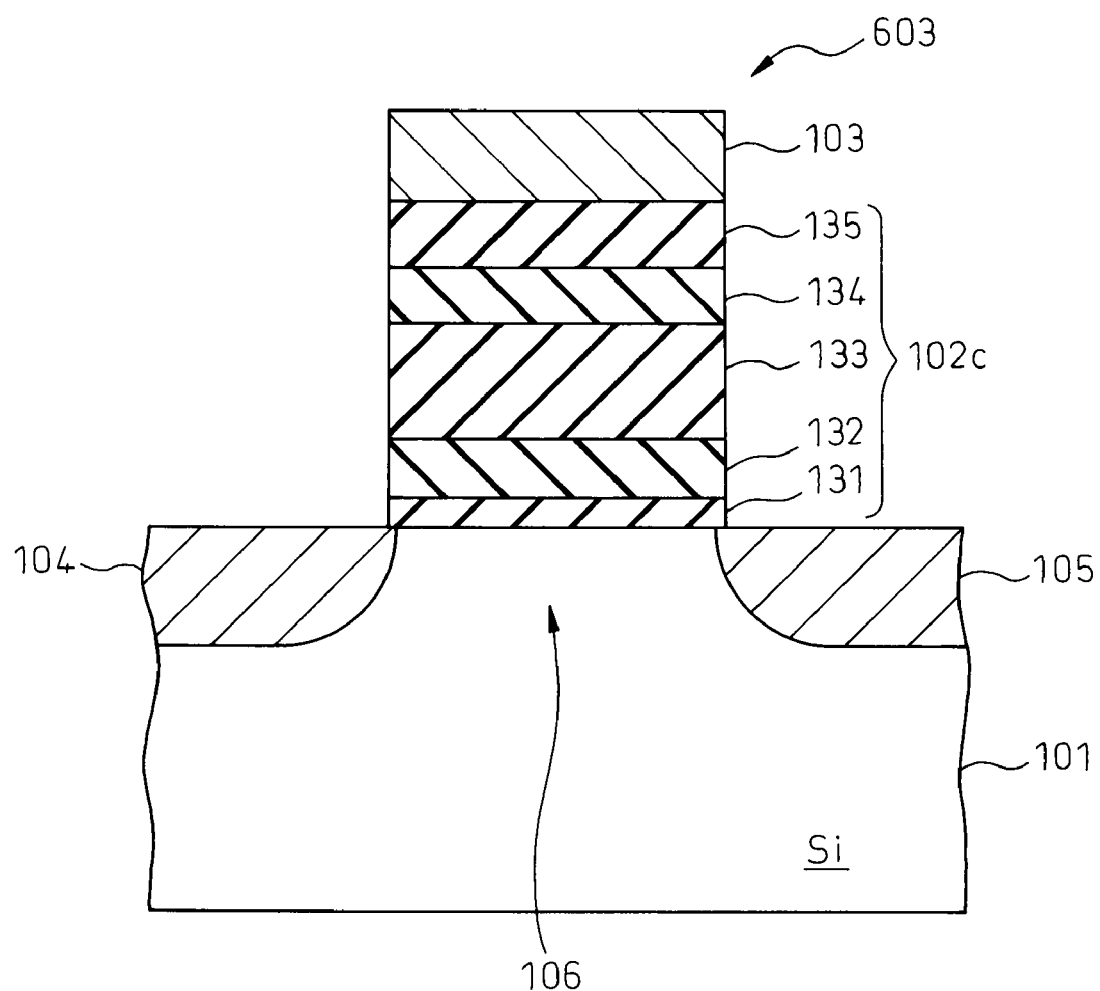
FIG. 6 is an explanatory diagram schematically showing the structure of a MOS semiconductor memory device according to a third embodiment of the present invention.
Figure 7:
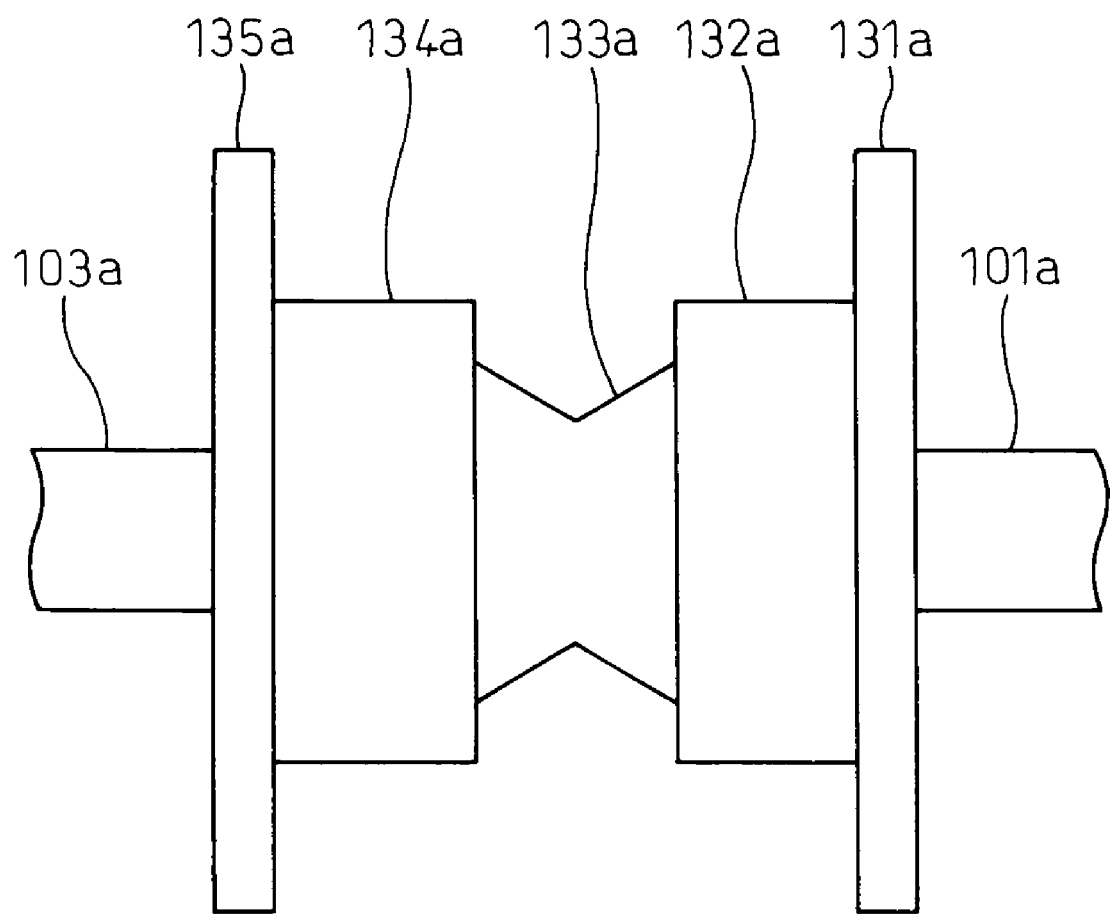
FIG. 7 is an energy band diagram of the MOS semiconductor memory device of FIG. 6.

FIG. 6 is a diagram schematically showing the structure of a MOS semiconductor memory device according to a third embodiment of the present invention. FIG. 7 is an energy band diagram of the MOS semiconductor memory device 603 of FIG. 6.

As shown in FIG. 6, the MOS semiconductor memory device 603 of this embodiment includes a p-type silicon substrate 101 as a semiconductor layer, an insulating film stack structure 102c constructed from a plurality of insulating films formed one on top of another on the p-type silicon substrate 101 and having different bandgap sizes, and a gate electrode 103 formed on top of the insulating film stack structure 102c. The insulating film stack structure 102c, which comprises a first insulating film 131, a second insulating film 132, a third insulating film 133, a fourth insulating film 134, and a fifth insulating film 135, is interposed between the silicon substrate 101 and the gate electrode 103. In the surface of the silicon substrate 101, a first source/drain 104 and a second source/drain 105 as n-type diffusion layers are formed to a prescribed depth so as to be disposed on both sides of the gate electrode 103; the region between the source/drain 104 and source/drain 105 is a channel forming region 106. The MOS semiconductor memory device 603 may be formed on a p-well or a p-type silicon layer formed in a semiconductor substrate. While the present embodiment will be described by taking an n-channel MOS device as an example, it will be appreciated that the memory device may be implemented as a p-channel MOS device. Accordingly, the following descriptions of the present embodiment are all applicable not only to an n-channel MOS device but also to a p-channel MOS device.

In the MOS semiconductor memory device 603 according to the present embodiment, the first insulating film 131, the fifth insulating film 135, and the gate electrode 103 are respectively identical in structure to the first insulating film 111, the fifth insulating film 115, and the gate electrode 103 in the semiconductor memory device 601 of the first embodiment shown in FIG. 1, and therefore descriptions thereof will not be repeated.

The second insulating film 132 is a silicon nitride-oxide film (SiON film) formed on the first insulating film 131. The second insulating film 132 has an energy bandgap, for example, in the range of 5 to 7 eV. Preferably, the thickness of the second insulating film 132 is, for example, in the range of 2 nm to 20 nm, more preferably in the range of 2 nm to 10 nm, and desirably in the range of 3 nm to 5 nm.

The third insulating film 133 is a silicon nitride film (SiN film) formed on the second insulating film 132. The third insulating film 133 has an energy bandgap, for example, in the range of 2.5 to 4 eV as an average taken across the entire film. Preferably, the thickness of the third insulating film 133 is, for example, in the range of 2 nm to 30 nm, more preferably in the range of 2 nm to 15 nm, and desirably in the range of 4 nm to 10 nm.

In the third insulating film 133, the proportion of nitrogen in the composition is varied across the thickness of the film in a direction moving away from the silicon substrate 101 and toward the gate electrode 103. More specifically, the third insulating film 133 has a nitrogen concentration profile such that the proportion of nitrogen in the film is small at or near the interface with the second insulating film 132, the proportion of nitrogen then increasing toward the center of the film and decreasing again toward the interface with the fourth insulating film 134. Such control of the nitrogen concentration in the film can be accomplished by varying the composition of the source gas, the pressure, etc., during the deposition of the silicon nitride film as the third insulating film 133 by CVD using the plasma processing apparatus 100 shown in FIG. 3. Alternatively, the nitrogen concentration in the film may be controlled by varying the composition of the source gas, the pressure, etc., for example, during the plasma oxidation of the silicon film that was formed by CVD or the like.

The fourth insulating film 134 is a silicon nitride-oxide film (SiON film) formed on the third insulating film 133. The fourth insulating film 134 has the same energy bandgap and the same thickness as those of the second insulating film 132.

The materials for the second, third, and fourth insulating films 132, 133, and 134 are not limited to silicon nitride or silicon nitride-oxide, but insulating materials such as metal oxides may be used. The same metal oxides as those listed as examples in the first embodiment can be used.

The method for forming the first to fifth insulating films 131 to 135 is not specifically limited but, as in the first embodiment, such methods as thermal oxidation, CVD, ALD, and nitriding or oxidation using atomic diffusion may be appropriately combined for use. In the present embodiment also, it is preferable that the second, third, and fourth insulating films 132, 133, and 134 that together serve a central role as the charge storing region are formed by plasma CVD using the plasma processing apparatus 100. That is, it is preferable to form the silicon nitride film by plasma CVD using the plasma processing apparatus 100 or to form the silicon nitride-oxide film by oxidizing the thus obtained silicon nitride film.

As shown in FIG. 7, the MOS semiconductor memory device 603 has an energy band structure such that the bandgaps 131a and 135a of the first and fifth insulating films 131 and 135 are larger than the bandgaps 132a, 133a, and 134a of the second, third, and fourth insulating films 132, 133, and 134 forming an intermediate stack structure interposed between the first and fifth insulating films 131 and 135. The first and fifth insulating films 131 and 135 are separated from the third insulating film 133 having the smallest bandgap by respectively interposing therebetween the second and fourth insulating films 132 and 134 having the intermediate bandgaps 132a and 134a. Further, the third insulating film 133 has a band structure such that, when viewed across the thickness of the film, the bandgap 133a is the smallest in the center of the film and increases toward both sides of the film (that is, toward the interfaces with the second and fourth insulating films 132 and 134). Such an energy band structure allows the charge to move easily by the tunnel effect across the first insulating film 131 at the time of data writing, and serves to enhance the writing speed and to reduce the write voltage necessary to inject the charge into the insulating film stack structure 102c. In the present embodiment, the bandgap size of each of the first to fifth insulating films 131 to 135 can be controlled by varying the elements forming the film and their composition ratio.

In the present embodiment, to enhance the write speed, it is preferable to set the thickness of each of the second and fourth insulating films 132 and 134 smaller than the thickness of the third insulating film 133 so that a phenomenon called coulomb blockade occurs at the time of writing. Further, from the viewpoint of increasing the probability of occurrence of tunneling to further enhance the write speed, it is preferable to set up the structure so that the electron potential energy in the conduction band of the silicon substrate 101 becomes higher than the electron potential energy in the conduction band of the second insulating film 132. Further, in order to improve the data retention characteristics, it is preferable to set up the structure so that, during data retention, the electron potential energy in the conduction band of the silicon substrate 101 is held lower than the electron potential energy in the conduction band of the second insulating film 132. Furthermore, it is preferable to set up the structure so that, at the time of data reading, the electron potential energy in the conduction band of the silicon substrate 101 becomes lower than the electron potential energy in the conduction band of the second insulating film 132, as in the case of data retention.

In the insulating film stack structure 102c, the charge tends to be stored primarily in the region centered around the third insulating film 133 having the smallest bandgap. In particular, in the present embodiment, since the composition ratio is varied across the thickness of the third insulating film 133, there occur many lattice gaps in the film, and therefore, there exist many dangling bonds. As a result, many traps for trapping the charge (charge trapping centers) are formed in the third insulating film 133, serving to increase the charge storage capability.

Further, once the charge is stored in the region centered around the third insulating film 133, energy barriers become greater because of the presence of the second and fourth insulating films 132 and 134, preventing the charge from escaping through the first or fifth insulating film 131 or 135. Accordingly, the charge can be retained stably within the insulating film stack structure 102c without having to increase the thicknesses of the first and fifth insulating films 131 and 135, and excellent date retention characteristics can thus be obtained.

Accordingly, compared with the prior art MOS semiconductor memory device, the MOS semiconductor memory device 603 achieves excellent data retention characteristics while also achieving high-speed data writing, low-power operation, and high reliability.

The read, write, and erasure operations of the MOS semiconductor memory device 603 according to the present embodiment can be performed in the same manner as in the first embodiment. Further, the MOS semiconductor memory device 603 can be fabricated using essentially the same process sequence as that described in the first embodiment.

Embodiment 4

Figure 8:
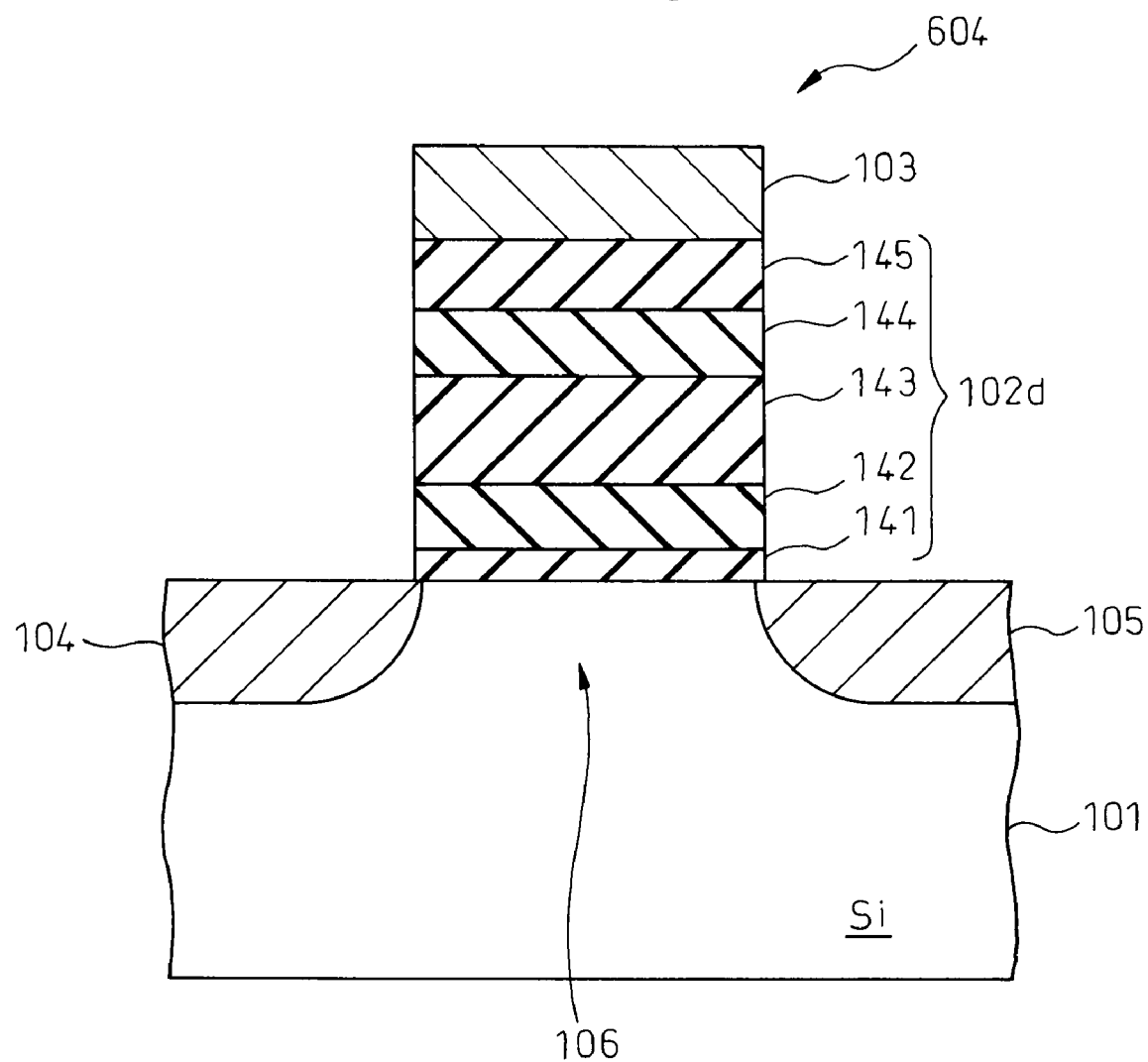
FIG. 8 is an explanatory diagram schematically showing the structure of a MOS semiconductor memory device according to a fourth embodiment of the present invention.
Figure 9:
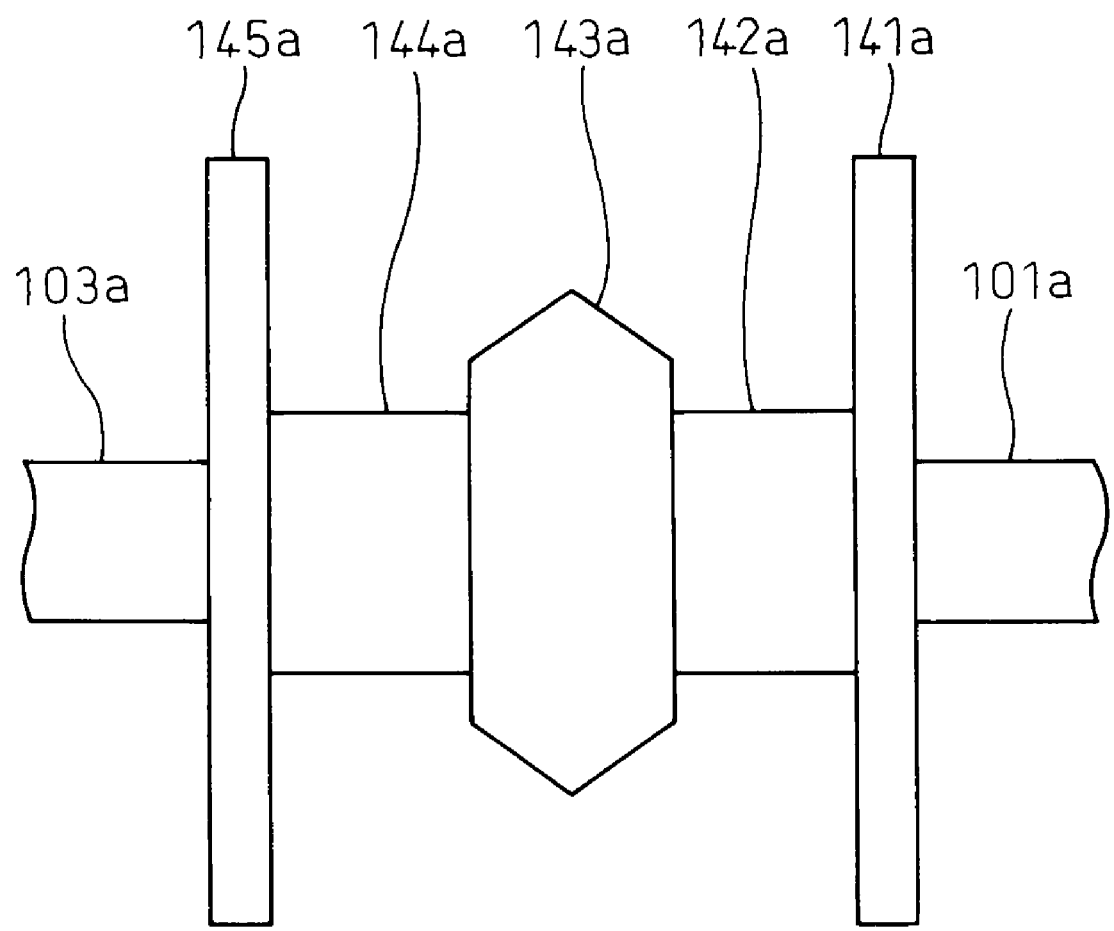
FIG. 9 is an energy band diagram of the MOS semiconductor memory device of FIG. 8.

FIG. 8 is a diagram schematically showing the structure of a MOS semiconductor memory device according to a fourth embodiment of the present invention. FIG. 9 is an energy band diagram of the MOS semiconductor memory device 604 of FIG. 8.

As shown in FIG. 8, the MOS semiconductor memory device 604 of this embodiment includes a p-type silicon substrate 101 as a semiconductor layer, an insulating film stack structure 102d constructed from a plurality of insulating films formed one on top of another on the p-type silicon substrate 101 and having different bandgap sizes, and a gate electrode 103 formed on top of the insulating film stack structure 102d. The insulating film stack structure 102d, which comprises a first insulating film 141, a second insulating film 142, a third insulating film 143, a fourth insulating film 144, and a fifth insulating film 145, is interposed between the silicon substrate 101 and the gate electrode 103. In the surface of the silicon substrate 101, a first source/drain 104 and a second source/drain 105 as n-type diffusion layers are formed to a prescribed depth so as to be disposed on both sides of the gate electrode 103; the region between the source/drain 104 and source/drain 105 is a channel forming region 106. The MOS semiconductor memory device 604 may be formed on a p-well or a p-type silicon layer formed in a semiconductor substrate. While the present embodiment will be described by taking an n-channel MOS device as an example, it will be appreciated that the memory device may be implemented as a p-channel MOS device. Accordingly, the following descriptions of the present embodiment are all applicable not only to an n-channel MOS device but also to a p-channel MOS device.

In the MOS semiconductor memory device 604 according to the present embodiment, the first insulating film 141, the fifth insulating film 145, and the gate electrode 103 are respectively identical in structure to the first insulating film 111, the fifth insulating film 115, and the gate electrode 103 in the semiconductor memory device 601 of the first embodiment shown in FIG. 1, and therefore descriptions thereof will not be repeated.

The second insulating film 142 is a silicon nitride film (SiN film) formed on the first insulating film 141. The second insulating film 142 has an energy bandgap, for example, in the range of 2.5 to 4 eV. Preferably, the thickness of the second insulating film 142 is, for example, in the range of 2 nm to 20 nm, more preferably in the range of 2 nm to 10 nm, and desirably in the range of 3 nm to 5 nm.

The third insulating film 143 is a silicon nitride-oxide film (SiON film) formed on the second insulating film 142. The third insulating film 143 has an energy bandgap, for example, in the range of 5 to 7 eV as an average taken across the entire film. Preferably, the thickness of the third insulating film 143 is, for example, in the range of 2 nm to 30 nm, more preferably in the range of 2 nm to 15 nm, and desirably in the range of 4 nm to 10 nm.

In the third insulating film 143, the proportion of oxygen in the composition is varied across the thickness of the film in a direction moving away from the silicon substrate 101 and toward the gate electrode 103. More specifically, the third insulating film 143 has a profile such that the proportion of oxygen to nitrogen in the film is small at or near the interface with the second insulating film 142, the proportion of oxygen then increasing toward the center of the film and decreasing again toward the interface with the fourth insulating film 144. Such control of the oxygen concentration in the film can be accomplished by varying the composition of the oxygen gas, the pressure, etc., for example, during the plasma oxidation of the silicon nitride film.

The fourth insulating film 144 is a silicon nitride film (SiN film) formed on the third insulating film 143. The fourth insulating film 144 has the same energy bandgap and the same thickness as those of the second insulating film 142.

The materials for the second, third, and fourth insulating films 142, 143, and 144 are not limited to silicon nitride or silicon nitride-oxide, but use may be made of insulating materials such as metal oxides. The same metal oxides as those listed as examples in the first embodiment can be used.

The method for forming the first to fifth insulating films 141 to 145 is not specifically limited but, as in the first embodiment, such methods as thermal oxidation, CVD, and nitriding or oxidation using atomic diffusion may be appropriately combined for use. In the present embodiment also, it is preferable that the second, third, and fourth insulating films 142, 143, and 144 that together serve a central role as the charge storing region are formed by plasma CVD using the plasma processing apparatus 100. That is, it is preferable to form the silicon nitride film by plasma CVD using the plasma processing apparatus 100 or to form the silicon nitride-oxide film by oxidizing the thus obtained silicon nitride film.

As shown in FIG. 9, the MOS semiconductor memory device 604 has an energy band structure such that the bandgaps 141a and 145a of the first and fifth insulating films 141 and 145 are larger than the bandgaps 142a, 143a, and 144a of the second, third, and fourth insulating films 142, 143, and 144 forming an intermediate stack structure interposed between the first and fifth insulating films 141 and 145. The first and fifth insulating films 141 and 145 are separated from the third insulating film 143 having the intermediate bandgap 143a by respectively interposing therebetween the second and fourth insulating films 142 and 144 each having the smallest bandgap. Further, the third insulating film 143 has a profile such that, when viewed across the thickness of the film, the bandgap is small at or near the interface with the second insulating film 142, the bandgap then increasing toward the center of the film and decreasing again toward the interface with the fourth insulating film 144. Such an energy band structure allows the charge to move easily by the tunnel effect across the first insulating film 141 at the time of data writing, and serves to enhance the writing speed and to reduce the write voltage necessary to inject the charge into the insulating film stack structure 102d. In the present embodiment, the bandgap size of each of the first to fifth insulating films 141 to 145 can be controlled by varying the elements forming the film and their composition ratio.

In the present embodiment, to enhance the write speed, it is preferable to set the thickness of each of the second and fourth insulating films 142 and 144 smaller than the thickness of the third insulating film 143 so that a phenomenon called coulomb blockade occurs at the time of writing. Further, from the viewpoint of increasing the probability of occurrence of tunneling to further enhance the write speed, it is preferable to set up the structure so that the electron potential energy in the conduction band of the silicon substrate 101 becomes higher than the electron potential energy in the conduction band of the second insulating film 142. Further, in order to improve the data retention characteristics, it is preferable to set up the structure so that, during data retention, the electron potential energy in the conduction band of the silicon substrate 101 is held lower than the electron potential energy in the conduction band of the second insulating film 142. Furthermore, it is preferable to set up the structure so that, at the time of data reading, the electron potential energy in the conduction band of the silicon substrate 101 becomes lower than the electron potential energy in the conduction band of the second insulating film 142, as in the case of data retention.

In the insulating film stack structure 102d, the charge tends to be stored primarily at or near the interfaces between the third insulating film 143 and the second and fourth insulating films 142 and 144 having the smaller bandgaps. In particular, in the present embodiment, since the composition ratio of oxygen atoms to nitrogen atoms is varied across the thickness of the third insulating film 143, there occur many lattice gaps in the film, and therefore, there exist many dangling bonds. As a result, many traps for trapping the charge (charge trapping centers) are formed in the third insulating film 143, serving to increase the charge storage capability.

Further, once the charge is stored in the region near the interface of the third insulating film 143, energy barriers become greater because of the presence of the second and fourth insulating films 142 and 144, preventing the charge from escaping through the first or fifth insulating film 141 or 145. Accordingly, the charge can be retained stably within the insulating film stack structure 102d without having to increase the thicknesses of the first and fifth insulating films 141 and 145, and excellent date retention characteristics can thus be obtained.

Accordingly, compared with the prior art MOS semiconductor memory device, the MOS semiconductor memory device 604 achieves excellent data retention characteristics while also achieving high-speed data writing, low-power operation, and high reliability.

The read, write, and erasure operations of the MOS semiconductor memory device 604 according to the present embodiment can be performed in the same manner as in the first embodiment. Further, the MOS semiconductor memory device 604 can be fabricated using essentially the same process sequence as that described in the first embodiment.

Embodiment 5

Figure 10:
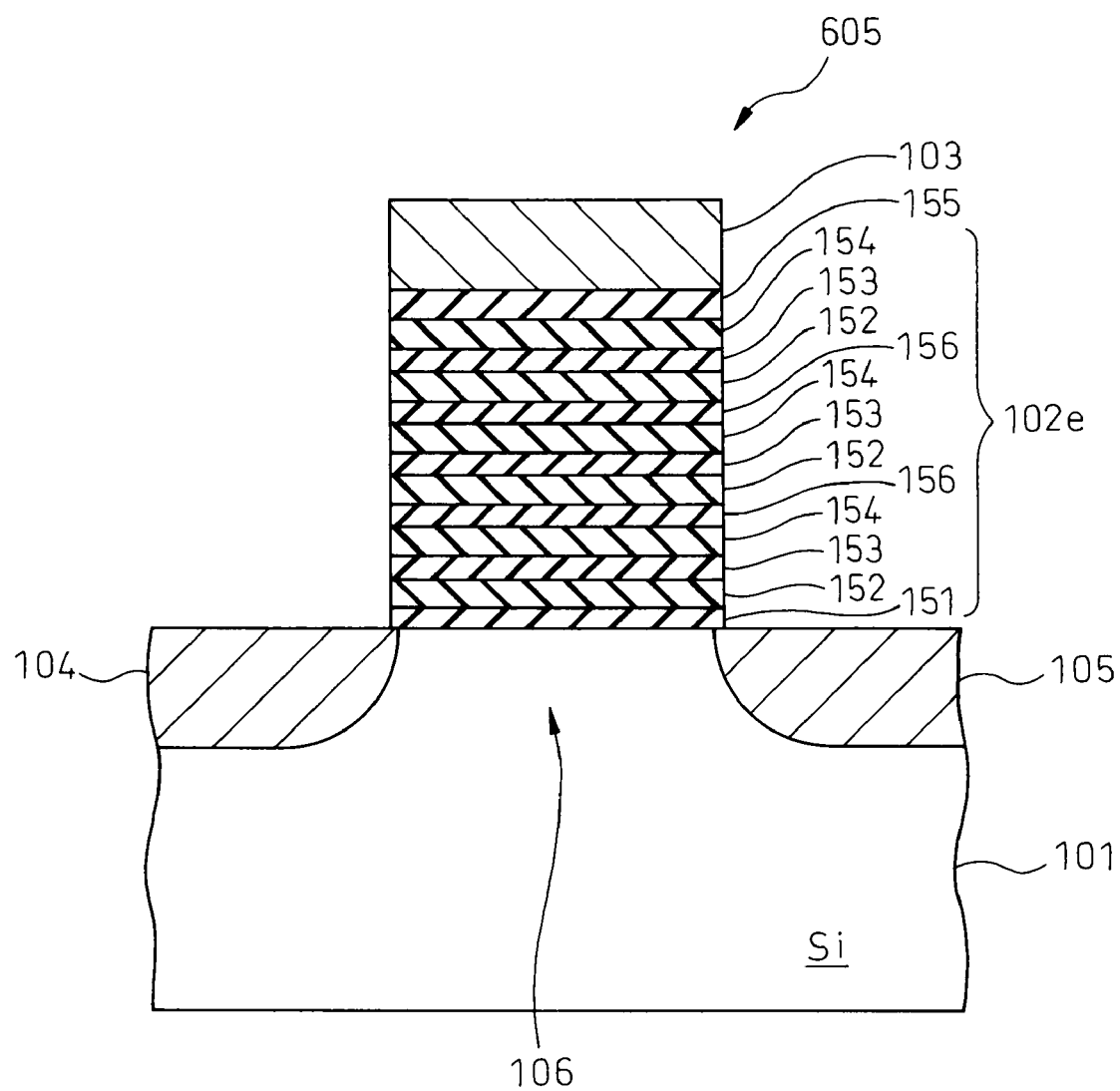
FIG. 10 is an explanatory diagram schematically showing the structure of a MOS semiconductor memory device according to a fifth embodiment of the present invention.
Figure 11:
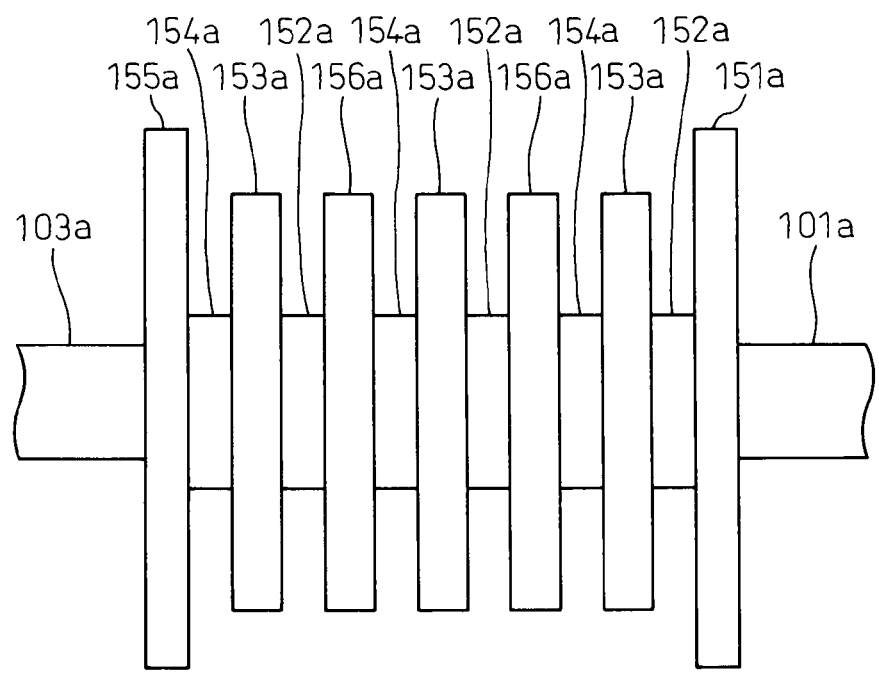
FIG. 11 is an energy band diagram of the MOS semiconductor memory device of FIG. 10.

FIG. 10 is a diagram schematically showing the structure of a MOS semiconductor memory device according to a fifth embodiment of the present invention. FIG. 11 is an energy band diagram of the MOS semiconductor memory device 605 of FIG. 10.

As shown in FIG. 10, the MOS semiconductor memory device 605 of this embodiment includes a p-type silicon substrate 101 as a semiconductor layer, an insulating film stack structure 102e constructed from a plurality of insulating films formed one on top of another on the p-type silicon substrate 101 and having different bandgap sizes, and a gate electrode 103 formed on top of the insulating film stack structure 102e. The insulating film stack structure 102e is interposed between the silicon substrate 101 and the gate electrode 103, and comprises a first insulating film 151, a second insulating film 152, a third insulating film 153, a fourth insulating film 154, a fifth insulating film 155, and a spacer insulating film 156. In the insulating film stack structure 102e, the three-layer structure comprising the second, third, and fourth insulating films 152, 153, and 154 is repeated three times, by interposing the spacer insulating film 156 between each three-layer structure.

On the other hand, in the surface of the silicon substrate 101, a first source/drain 104 and a second source/drain 105 as n-type diffusion layers are formed to a prescribed depth so as to be disposed on both sides of the gate electrode 103; the region between the source/drain 104 and source/drain 105 is a channel forming region 106. While the present embodiment will be described by taking an n-channel MOS device as an example, it will be appreciated that the memory device may be implemented as a p-channel MOS device. Accordingly, the following descriptions of the present embodiment are all applicable not only to an n-channel MOS device but also to a p-channel MOS device.

In the MOS semiconductor memory device 605 according to the present embodiment, the first insulating film 151, the fifth insulating film 155, and the gate electrode 103 are respectively identical in structure to the first insulating film 111, the fifth insulating film 115, and the gate electrode 103 in the semiconductor memory device 601 of the first embodiment shown in FIG. 1, and therefore, their descriptions will not be repeated here.

The second insulating film 152 is a silicon nitride film (SiN film) formed on the first insulating film 151. The second insulating film 152 has an energy bandgap, for example, in the range of 2.5 to 4 eV. Preferably, the thickness of the second insulating film 152 is, for example, in the range of 2 nm to 20 nm, more preferably in the range of 2 nm to 10 nm, and desirably in the range of 3 nm to 5 nm.

The third insulating film 153 is a silicon nitride-oxide film (SiON film) formed on the second insulating film 152. The third insulating film 153 has an energy bandgap, for example, in the range of 5 to 7 eV. Preferably, the thickness of the third insulating film 153 is, for example, in the range of 2 nm to 30 nm, more preferably in the range of 2 nm to 15 nm, and desirably in the range of 4 nm to 10 nm.

The fourth insulating film 154 is a silicon nitride film (SiN film) formed on the third insulating film 153. The fourth insulating film 154 has the same energy bandgap and the same thickness as those of the second insulating film 152.

The spacer insulating film 156 is a silicon nitride-oxide film (SiON film) formed on the fourth insulating film 154. In the present embodiment, a film identical to the one used as the third insulating film 153 can be used as the spacer insulating film 156. That is, the spacer insulating film 156 has an energy bandgap, for example, in the range of 5 to 7 eV. Preferably, the thickness of the spacer insulating film 156 is, for example, in the range of 2 nm to 30 nm, more preferably in the range of 2 nm to 15 nm, and desirably in the range of 4 nm to 10 nm.

The materials for the second, third, and fourth insulating films 152, 153, and 154 and spacer insulating film 156 are not limited to silicon nitride or silicon nitride-oxide, but use may be made of insulating materials such as metal oxides. The same metal oxides as those listed as examples in the first embodiment can be used.

The method for forming the first to fifth insulating films 151 to 155 and spacer insulating film 156 is not specifically limited but, as in the first embodiment, such methods as thermal oxidation, CVD, and nitriding or oxidation using atomic diffusion may be appropriately combined for use. In the present embodiment also, it is preferable that the second, third, and fourth insulating films 152, 153, and 154 that together serve a central role as the charge storing region are formed by plasma CVD using the plasma processing apparatus 100. That is, it is preferable to form the silicon nitride film by plasma CVD using the plasma processing apparatus 100 or to form the silicon nitride-oxide film by oxidizing the thus obtained silicon nitride film.

As shown in FIG. 11, the MOS semiconductor memory device 605 has an energy band structure such that the bandgaps 151a and 155a of the first and fifth insulating films 151 and 155 are larger than the bandgaps 152a, 153a, 154a, and 156a of the second, third, and fourth insulating films 152, 153, and 154 and spacer insulating film 156 forming an intermediate stack structure interposed between the first and fifth insulating films 151 and 155. The second and fourth insulating films 152 and 154, each having the smallest bandgap, are disposed at positions contacting the first and fifth insulating films 151 and 155, respectively. Such an energy band structure allows the charge to move easily by the tunnel effect across the first insulating film 151 at the time of data writing, and serves to enhance the writing speed and to reduce the write voltage necessary to inject the charge into the insulating film stack structure 102e. In the present embodiment, the bandgap size of each of the first to fifth insulating films 151 to 155 and spacer insulating film 156 can be controlled by varying the elements forming the film and their composition ratio.

In the present embodiment, to enhance the write speed, it is preferable to set the thickness of each of the second and fourth insulating films 152 and 154 less than the thickness of the third insulating film 153 so that a phenomenon called coulomb blockade occurs at the time of writing. Further, from the viewpoint of increasing the probability of occurrence of tunneling to further enhance the write speed, it is preferable to set up the structure so that the electron potential energy in the conduction band of the silicon substrate 101 becomes higher than the electron potential energy in the conduction band of the second insulating film 152. Further, in order to improve the data retention characteristics, it is preferable to set up the structure so that, during data retention, the electron potential energy in the conduction band of the silicon substrate 101 is held lower than the electron potential energy in the conduction band of the second insulating film 152. Furthermore, it is preferable to set up the structure so that, at the time of data reading, the electron potential energy in the conduction band of the silicon substrate 101 becomes lower than the electron potential energy in the conduction band of the second insulating film 152, as in the case of data retention.

In the insulating film stack structure 102e, the charge tends to be stored primarily at or near the interfaces between the third insulating film 153 and the second and fourth insulating films 152 and 154 having the smaller bandgaps. Once the charge is stored in the region near the interface of the third insulating film 153, energy barriers become greater because of the presence of the second and fourth insulating films 152 and 154, preventing the charge from escaping through the first or fifth insulating film 151 or 155. Accordingly, the charge can be retained stably within the insulating film stack structure 102e without having to increase the thicknesses of the first and fifth insulating films 151 and 155, and excellent date retention characteristics can thus be obtained.

Accordingly, compared with the prior art MOS semiconductor memory device, the MOS semiconductor memory device 605 achieves excellent data retention characteristics while also achieving high-speed data writing, low-power operation, and high reliability.

In the present embodiment, the three-layer structure comprising the second, third, and fourth insulating films 152, 153, and 154 has been repeated three times, but the structure may be repeated two times or four or more times. Further, in the present embodiment, the three-layer structures, each comprising the second, third, and fourth insulating films 152, 153, and 154, have been stacked one on top of another by interposing the spacer insulating film 156, but the spacer insulating film 156 may be omitted.

In the present embodiment also, the third insulating film 153 may be formed to have the same bandgap structure as that shown in the third or fourth embodiment by varying the composition ratio of nitrogen to silicon or the composition ratio of oxygen to nitrogen in the third insulating film 153 across the thickness thereof.

Figure 12:
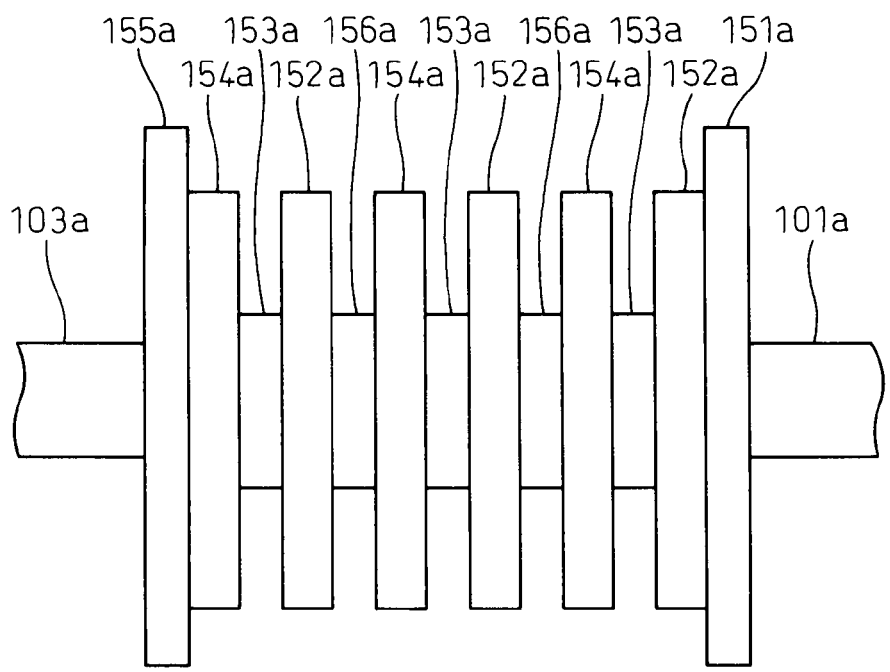
FIG. 12 is an energy band diagram of another example of the MOS semiconductor memory device of FIG. 10.

Further, in the MOS semiconductor memory device 605 shown in FIG. 10, the second insulating film 152 may be formed from a silicon nitride-oxygen film (SiON film), the third insulating film 153 from a silicon nitride film (SiN film), the fourth insulating film 154 from a silicon nitride-oxygen film (SiON film), and the spacer insulating film 156 from a silicon nitride film (SiN film). One example of the energy band structure in that case is shown in FIG. 12. Such an energy band structure allows the charge to move easily by the tunnel effect across the first insulating film 151 at the time of data writing, and serves to enhance the writing speed and to reduce the write voltage necessary to inject the charge into the insulating film stack structure 102e. Further, in this case, since the charge tends to be stored primarily in the region centered around the third insulating film 153, the charge can be retained stably within the insulating film stack structure 102e without having to increase the thicknesses of the first and fifth insulating films 151 and 155, and excellent data retention characteristics can thus be obtained.

The read, write, and erasure operations of the MOS semiconductor memory device 605 according to the present embodiment can be performed in the same manner as in the first embodiment. Further, the MOS semiconductor memory device 605 can be fabricated using essentially the same process sequence as that described in the first embodiment.

Embodiment 6

Figure 13:
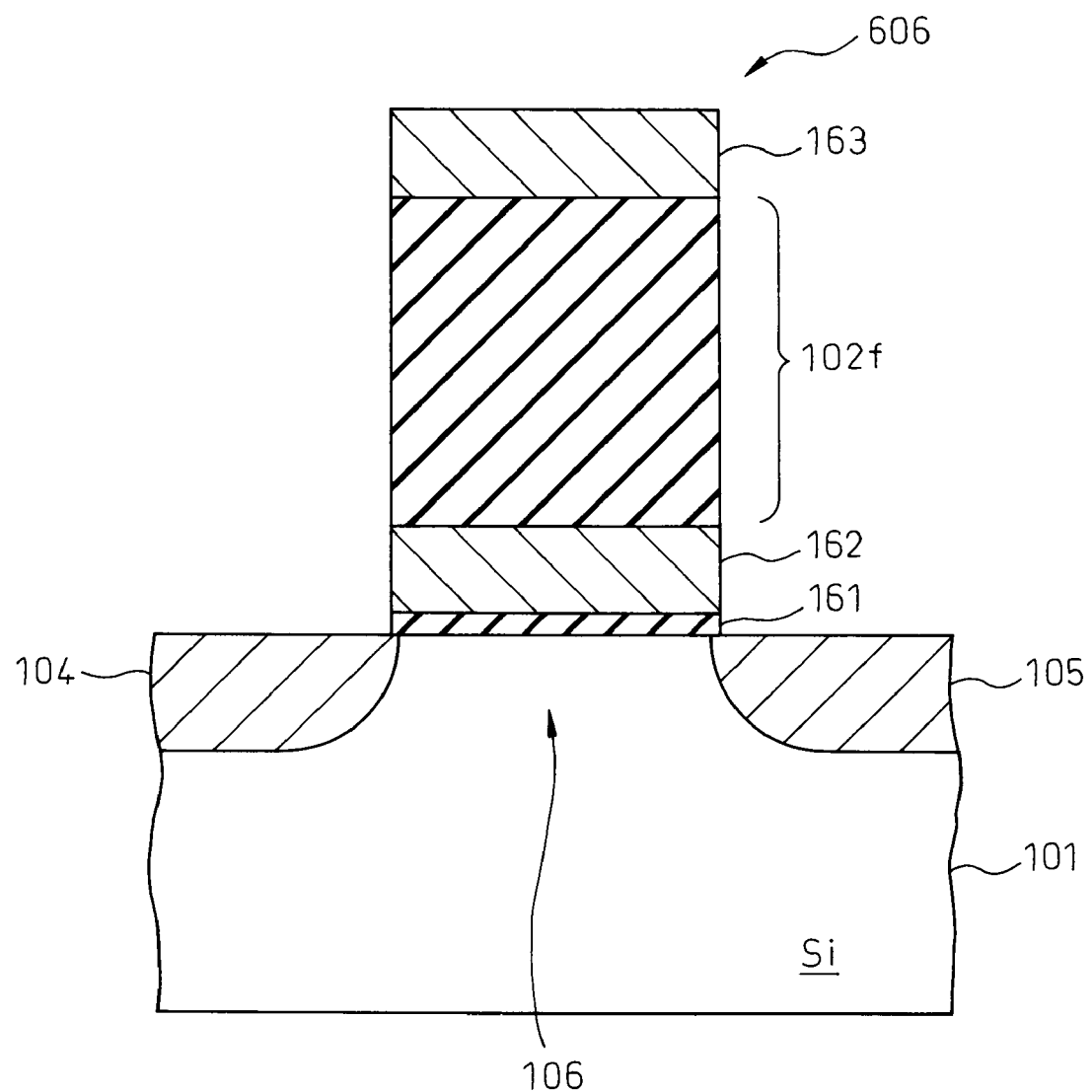
FIG. 13 is an explanatory diagram schematically showing the structure of a MOS semiconductor memory device according to a sixth embodiment of the present invention.

FIG. 13 is a diagram schematically showing the structure of a MOS semiconductor memory device according to a sixth embodiment of the present invention. As shown in FIG. 13, the MOS semiconductor memory device 606 of this embodiment includes a p-type silicon substrate 101 as a semiconductor layer, an insulating film 161 formed on the p-type silicon substrate 101, a first gate electrode 162 formed on top of the insulating film 161, an insulating film stack structure 102f constructed from a plurality of insulating films formed one on top of another on the first gate electrode 162 and having different bandgap sizes, and a second gate electrode 163 formed on top of the insulating film stack structure 102f. In the surface of the silicon substrate 101, a first source/drain 104 and a second source/drain 105 as n-type diffusion layers are formed to a prescribed depth so as to be disposed on both sides of the gate electrode 163; the region between the source/drain 104 and source/drain 105 is a channel forming region 106. The MOS semiconductor memory device 604 may be formed on a p-well or a p-type silicon layer formed in a semiconductor substrate. While the present embodiment will be described by taking an n-channel MOS device as an example, it will be appreciated that the memory device may be implemented as a p-channel MOS device. Accordingly, the following descriptions of the present embodiment are all applicable not only to an n-channel MOS device but also to a p-channel MOS device.

In the MOS semiconductor memory device 606 according to the present embodiment, the insulating film 161 is identical in structure to the first insulating film 111 in the semiconductor memory device 601 of the first embodiment shown in FIG. 1, and the first and second gate electrodes 162 and 163 in the MOS semiconductor memory device 606 are each identical in structure to the gate electrode 103 in the semiconductor memory device 601 of the first embodiment; therefore, their descriptions will not be repeated here.

Further, any one of the insulating film stack structures 102a to 102e shown in the first to fifth embodiments described above can be used as the insulating film stack structure 102f interposed between the first gate electrode 162 and the second gate electrode 163. In FIG. 13, the individual insulating films constituting the insulating film stack structure 102f are omitted from illustration.

In the MOS semiconductor memory devices 601 to 605 according to the first to fifth embodiments described above (FIGS. 1, 4, 6, 8, and 10), data has been rewritten by causing the charge to move between the silicon substrate 101 as the semiconductor layer and the gate electrode 103; by contrast, in the MOS semiconductor memory device 606 according to the present embodiment, data can be rewritten by causing the charge to move between the first gate electrode 162 and second gate electrode 163 formed on the insulating film 161.

An example of the operation of the MOS semiconductor memory device 606 having the above structure will be described below. First, when writing data, the first source/drain 104 and the second source/drain 105 are held at 0 V relative to the potential of the silicon substrate 101, and while holding the first gate electrode 162 in a floating state, a prescribed positive voltage is applied to the second gate electrode 163. At this time, electrons are stored in the channel forming region 106, forming an inverted layer, and part of the charge in the inverted layer moves through the insulating film 161 and the first gate electrode 162 into the insulating film stack structure 102f by virtue of the tunnel effect. Alternatively, when writing data, part of the charge may be caused to move from the first gate electrode 162 into the insulating film stack structure 102f by applying a prescribed positive voltage to the second gate electrode 163 while holding the first source/drain 104, the second source/drain 105, and the first gate electrode 162 at 0 V relative to the potential of the silicon substrate 101. The electrons that moved into the insulating film stack structure 102f are trapped in the charge trapping centers formed therein, and the data is thus stored. In the case of the prior art device, there have been problems such as large write voltage and slow writing speed because the charge has to be injected through a thick insulating film (see FIG. 14(a)). By contrast, according to the present invention, since the structure is set up so that the electron potential energy in the conduction band of the silicon substrate 101 becomes higher than the electron potential energy in the conduction band of the second insulating film (for example, the second insulating film 112, 122, 132, 142, or 152), the charge can be injected through a thin insulating film (see FIG. 14(d)). Therefore, in the device according to the present invention, it is possible to reduce the write voltage and enhance the writing speed.

On the other hand, when reading data, either one of the first source/drain 104 and second source/drain 105 is held at 0 V relative to the potential of the silicon substrate 101, and a prescribed voltage is applied to the other one. The prescribed voltage is also applied to the second gate electrode 163. The first gate electrode 162 is held in a floating state. When the voltage is applied in this way, the amount of channel current or the drain voltage changes according to the presence or absence of charge stored in the insulating film stack structure 102f or the amount of stored charge. The stored data can therefore be read out by detecting the change in the channel current or the drain voltage. Here, in the case of the prior art device, there have been problems such as large read voltage and slow reading speed because information on the presence or absence of stored charge or the amount of stored charge is read out through a thick insulating film (see FIG. 14(c)). By contrast, according to the present invention, since the structure is set up so that the electron potential energy in the conduction band of the silicon substrate 101 becomes lower than the electron potential energy in the conduction band of the second insulating film (for example, the second insulating film 112, 122, 132, 142, or 152), the mean effective barrier can be reduced though a thick insulating film is interposed (see FIG. 14(f)). In the device according to the present invention, therefore, it becomes possible to reduce the read voltage and enhance the reading speed.

When erasing data, the first source/drain 104 and the second source/drain 105 are both held at 0 V relative to the potential of the silicon substrate 1, and while holding the first gate electrode 162 in a floating state, a negative voltage of prescribed magnitude is applied to the second gate electrode 163. With the voltage thus applied, the electrons retained in the insulating film stack structure 102f are drawn into the channel forming region 106 of the silicon substrate 101 via the insulating film 161. The MOS semiconductor memory device 606 thus changes back to the erased state where the amount of stored charge is low. Alternatively, when erasing data, the electrons retained in the insulating film stack structure 102f may be drawn into the channel forming region 106 of the silicon substrate 101 via the insulating film 161 by applying a prescribed negative voltage to the second gate electrode 163 while holding the first source/drain 104, the second source/drain 105, and the first gate electrode 162 at 0 V relative to the potential of the silicon substrate 101. In the case of the prior art device, there have been problems such as large erasure voltage and slow erasing speed because the charge has to be released through a thick insulating film (see FIG. 14(b)). By contrast, according to the present invention, since the structure is set up so that the electron potential energy in the conduction band of the silicon substrate 101 becomes higher than the electron potential energy in the conduction band of the second insulating film (for example, the second insulating film 112, 122, 132, 142, or 152), the charge can be released through a thin insulating film (see FIG. 14(e)). Therefore, in the device according to the present invention, it is possible to reduce the erasure voltage and enhance the erasing speed.

The information read, write, and erasure method of the MOS semiconductor memory device 606 is not limited to the above method, but the read, write, and erasure operations may be performed using other suitable methods. Further, if provisions are made to be able to write and read two or more bits of information to and from each memory cell by not fixing the functions of the first source/drain 104 and second source/drain 105 but by making them function as the source and drain in turn, the memory capacity can be increased.

As described above, compared with the prior art MOS semiconductor memory device, the MOS semiconductor memory device 606 according to the present embodiment, like any of the MOS semiconductor memory devices 601 to 605 according to the first to fifth embodiments, achieves excellent data retention characteristics while also achieving high-speed data writing, low-power operation, and high reliability. The MOS semiconductor memory device 606 according to the present embodiment also can be fabricated using essentially the same process sequence as that described in the first embodiment.

As described above with reference to the first to sixth embodiments, the present invention can be utilized by making various modifications provided that the threshold value of the memory cell changes according to the charge present in the insulating film. For example, information read, write, and erasure can be performed by utilizing various physical phenomena such as FN tunneling, hot electron injection, hot hole injection, electro-optical effect, etc.

Next, referring again to FIG. 14, the operation of the MOS semiconductor memory device according to the above embodiment will be described. FIGS. 14(a) to 14(c) are energy diagrams schematically illustrating energy states at the time of writing, erasure, and data retention in the prior art MOS semiconductor memory device. On the other hand, FIGS. 14(d) to 14(f) are energy diagrams schematically illustrating energy states at the time of writing, erasure, and data retention in the MOS semiconductor memory device of the present invention. In the MOS semiconductor memory device according to any one of the first to sixth embodiments, the charge is retained in the first to fifth insulating films by exhibiting a certain distribution, but since the region centered around the third insulating film or the region at or near its interface is primarily the region responsible for charge storage, this region is described as the "charge storing region" in FIG. 14 for convenience of explanation.

The probability that electrons move between the silicon substrate and the charge storing region is inversely proportional to the size of the energy barrier EB (i.e., the height H and width T of the energy barrier EB). If the bandgap of the first insulating film is increased, the height H of the energy barrier EB increases, thus limiting the movement of electrons between the silicon substrate and the charge storing region. If the thickness of the first insulating film is increased, since the width T increases, the energy barrier EB also increases. In this way, increasing the thickness of the first insulating film is an effective method to prevent the electrons retained in the charge storing region from escaping through the first insulating film into the silicon substrate. Accordingly, to increase the charge retention capability of the MOS semiconductor memory device, the bandgap and thickness of the first insulating film should be increased thereby increasing the height H and width T of the energy barrier EB of the first insulating film, as shown in FIG. 14(c).

However, if the thickness of the first insulating film is increased, the injection of electrons from the silicon substrate into the charge storing region by the tunnel effect, for example, at the time of writing, becomes difficult to occur, and a large write voltage has to be applied at the time of writing, as shown in FIG. 14(a). Furthermore, at the time of erasure, a large erasure voltage has to be applied, as shown in FIG. 14(b). To reduce the write voltage and erasure voltage, the bandgap and thickness of the first insulating film should be reduced, but in that case, the energy barrier EB also becomes smaller, resulting in degradation of the data retention characteristics.

In the present invention, as illustrated in the first to sixth embodiments, there are provided, adjacent to the first and fifth insulating films having large bandgaps, the second and fourth insulating films having the smaller bandgaps. When such an energy band structure is employed, the width of the energy barrier EB, at the time of writing, becomes equal to T1 which is equivalent to the thickness of the first insulating film, as shown in FIG. 14(d), so that even if the write voltage is reduced, electrons move smoothly from the silicon substrate into the charge storing region through the large bandgap first insulating film. At the time of erasure also, the width of the energy barrier EB becomes equal to T1 as shown in FIG. 14(e), so that even if the erasure voltage is reduced, electrons move smoothly from the charge storing region into the silicon substrate. Though not shown here, the situation is the same when the electrons are drawn from the charge storing region into the gate electrode 103 through the fifth insulating film. On the other hand, as shown in FIG. 14(f), when the electrons are retained in the charge storing region, the first insulating film (fifth insulating film) and the second insulating film (fourth insulating film) combine to provide the energy barrier EB whose width T thus increases; as a result, the charge can be prevented from escaping from the charge storing region, without having to increase the thickness of the first insulating film (fifth insulating film), and excellent charge retention characteristics can thus be obtained.

Figure 15:
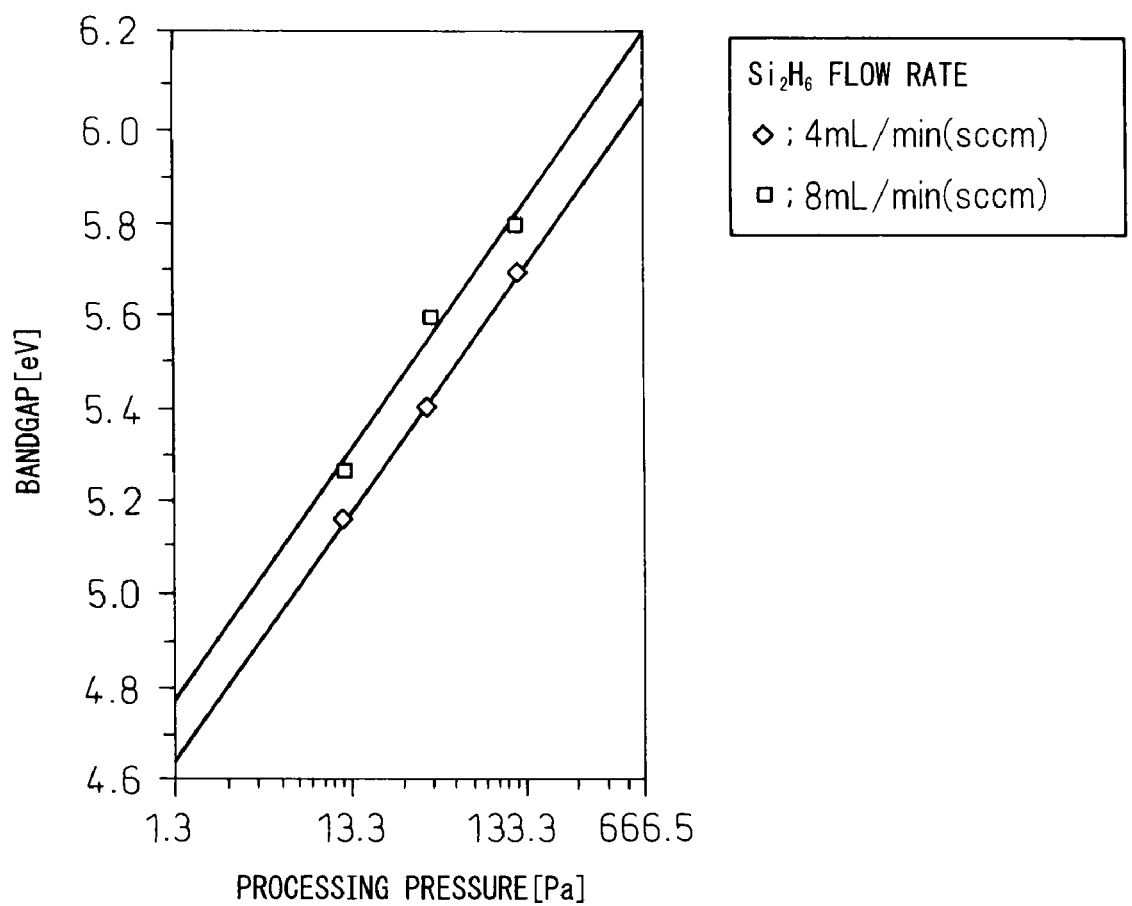
FIG. 15 is a graph showing the relationship between processing pressure and bandgap in a plasma CVD process using ammonia as a source gas for film deposition.
Figure 16:
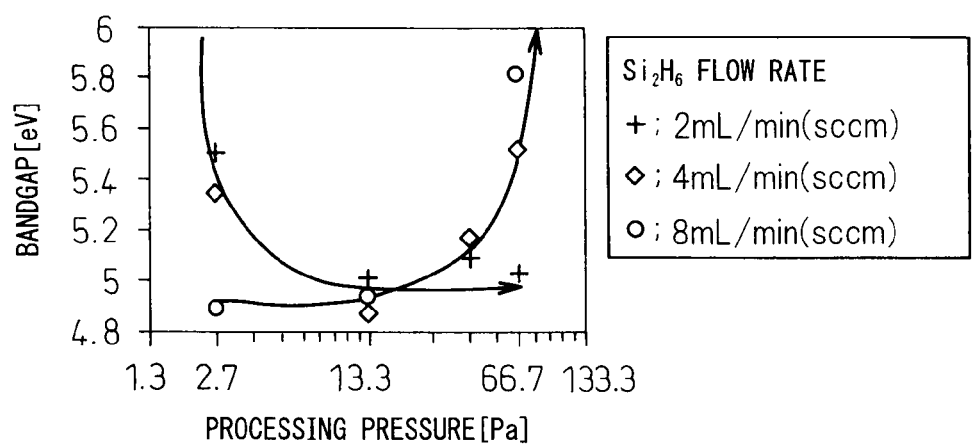
FIG. 16 is a graph showing the relationship between processing pressure and bandgap in a plasma CVD process using nitrogen as a source gas for film deposition.

In the first to sixth embodiments described above, the bandgap size of each insulating film has been controlled by changing the material of the insulating film. It will, however, be noted that the insulting films having different bandgap sizes can also be deposited one on top of another without changing the materials of the respective insulating films but by varying the plasma CVD conditions in the plasma processing apparatus 100. More specifically, in the plasma processing apparatus 100, the bandgap of the silicon nitride film can be controlled to the desired size by appropriately selecting the plasma CVD conditions, especially the pressure conditions, when depositing the silicon nitride film. This will be explained based on experimental data. FIGS. 15 and 16 each show the relationship between the bandgap of the silicon nitride film and the processing pressure, for the case where the silicon nitride film of a single-layer structure was fabricated by plasma CVD using the plasma processing apparatus 100. FIG. 15 shows the results when an $NH_3$ gas was used as the nitrogen-containing gas and a $Si_2H_6$ gas as the silicon-containing gas, while FIG. 16 shows the results when an $N_2$ gas was used as the nitrogen-containing gas and a $Si_2H_6$ gas as the silicon-containing gas. The plasma CVD conditions were as follows:

[Common Conditions]
  Processing temperature (susceptor): 400° C.
  Microwave power: 2 kW (power density: 1.02 W/cm² of the transmission plate)
[Processing Conditions for $NH_3/Si_2H_6$]
  Processing pressure: 13.3 Pa (100 mTorr) to 133.3 Pa (1000 mTorr)
  Ar gas flow rate: 200 mL/min (sccm)
  $NH_3$ gas flow rate: 200 mL/min (sccm)
  $Si_2H_6$ gas flow rate: 4 or 8 mL/min (sccm)
[Processing Conditions for $N_2/Si_2H_6$]
  Processing pressure: 2.7 Pa (20 mTorr) to 66.7 Pa (500 mTorr)
  Ar gas flow rate: 200 mL/min (sccm)
  $N_2$ gas flow rate: 200 mL/min (sccm)
  $Si_2H_6$ gas flow rate: 2, 4, or 8 mL/min (sccm)

The bandgap of the silicon nitride film was measured using thin-film characteristic measuring equipment n&k Analyzer (trade name, manufactured by n&k Technology Inc.).

As shown in FIG. 15, in the plasma CVD conducted using the $NH_3/Si_2H_6$ source gases, the bandgap of the resulting silicon nitride film varied over the range of about 5.1 eV to 5.8 eV when the processing pressure was varied over the range of 13.3 Pa to 133.3 Pa. That is, the silicon nitride film having the desired bandgap can be easily obtained by varying only the processing pressure while holding the $Si_2H_6$ flow rate constant. In this case, the processing pressure may be controlled as a primary parameter, and if needed, the $Si_2H_6$ flow rate may be controlled as a secondary parameter. For example, the $Si_2H_6$ flow rate is preferably set in the range of not smaller than 3 mL/min (sccm) but not larger than 40 mL/min (sccm), and more preferably in the range of not smaller than 3 mL/min (sccm) but not larger than 20 mL/min (sccm). On the other hand, the $NH_3$ flow rate is preferably set in the range of not smaller than 50 mL/min (sccm) but not larger than 1000 mL/min (sccm), and more preferably in the range of not smaller than 50 mL/min (sccm) but not larger than 500 mL/min (sccm). The flow rate ratio between the $Si_2H_6$ gas and the $NH_3$ gas ($Si_2H_6/NH_3$) is preferably set in the range of not smaller than 0.015 but not larger than 0.2, and more preferably in the range of not smaller than 0.015 but not larger than 0.1.

Further, as shown in FIG. 16, in the plasma CVD conducted using the $N_2/Si_2H_6$ source gases, the bandgap of the resulting silicon nitride film varied over the range of about 4.9 eV to 5.8 eV when the processing pressure was varied over the range of 2.7 Pa to 66.7 Pa. When the processing pressure was 2.7 Pa or 66.7 Pa, it was possible to change the bandgap size by changing the flow rate of the $Si_2H_6$ gas. In this case, the flow rate ratio between the $Si_2H_6$ gas and the $N_2$ gas ($Si_2H_6/N_2$) is preferably set in the range of not smaller than 0.01 but not larger than 0.2, and more preferably in the range of not smaller than 0.01 but not larger than 0.1.

By controlling the processing pressure and the source gas flow rate ratio as described above, the silicon nitride film having a bandgap of 4.9 eV or larger can be obtained.

For comparison purposes, silicon nitride films were fabricated by LPCVD by varying the processing pressure in like manner, but the bandgap remained within a 0.1-eV range of 4.9 eV to 5 eV, and it was difficult to control the bandgap in the case of LPCVD.

As described above, in the plasma CVD using the plasma processing apparatus 100, the major factor that determines the bandgap size of the film is the processing pressure. That is, it has been verified that the silicon nitride film having the larger bandgap and the silicon nitride film having the smaller bandgap can be easily fabricated using the plasma processing apparatus 100 by only varying the processing pressure while holding the other conditions constant.

[Fabrication of Large-Bandgap Film]

If it is desired to fabricate a silicon nitride film having a large bandgap (for example, a bandgap in the range of 5 eV to 7 eV), it is preferable to conduct the plasma CVD using the following conditions.

When using an ammonia/silane gas mixture, for example, an $NH_3$ gas as the nitrogen-containing gas and a $Si_2H_6$ gas as the silicon-containing gas, it is preferable to set the processing pressure in the range of 1 to 1333 Pa, and more preferably in the range of 1 to 133 Pa. In this case, the proportion of the flow rate of the $NH_3$ gas to the total gas flow rate is in the range of 10 to 99.99%, and more preferably in the range of 90 to 99.9%, and the proportion of the flow rate of the $Si_2H_6$ gas to the total gas flow rate is in the range of 0.01 to 90%, and more preferably in the range of 0.1 to 10%. At this time, from the standpoint of increasing the amount of charge trapping in the silicon nitride film, enhancing the writing speed and erasing speed, and increasing the charge retention capability, the flow rate ratio between the $Si_2H_6$ gas and the $NH_3$ gas ($Si_2H_6$ gas flow rate/$NH_3$ gas flow rate) is preferably set in the range of 0.015 to 0.2. Further, the flow rate of the rare gas can be chosen from the range of 20 to 2000 mL/min (sccm), and more preferably from the range of 20 to 1000 mL/min (sccm), the flow rate of the $NH_3$ gas can be chosen from the range of 20 to 3000 mL/min (sccm), and more preferably from the range of 20 to 1000 mL/min (sccm), and the flow rate of the $Si_2H_6$ gas can be chosen from the range of 0.1 to 50 mL/min (sccm), and more preferably from the range of 0.5 to 10 mL/min (sccm), in such a manner as to achieve the above flow rate proportions.

When using a nitrogen/silane gas mixture, for example, an $N_2$ gas as the nitrogen-containing gas and a $Si_2H_6$ gas as the silicon-containing gas, it is preferable to set the processing pressure in the range of 1 to 1333 Pa, and more preferably in the range of 1 to 133 Pa. In this case, the proportion of the flow rate of the $N_2$ gas to the total gas flow rate is in the range of 10 to 99.99%, and more preferably in the range of 90 to 99.9%, and the proportion of the flow rate of the $Si_2H_6$ gas to the total gas flow rate is in the range of 0.01 to 90%, and more preferably in the range of 0.01 to 10%. At this time, from the standpoint of increasing the amount of charge trapping in the silicon nitride film, enhancing the writing speed and erasing speed, and increasing the charge retention capability, the flow rate ratio between the $Si_2H_6$ gas and the $N_2$ gas ($Si_2H_6$ gas flow rate/$N_2$ gas flow rate) is preferably set in the range of 0.01 to 0.2. Further, the flow rate of the rare gas can be chosen from the range of 20 to 3000 mL/min (sccm), and more preferably from the range of 20 to 1000 mL/min (sccm), the flow rate of the $N_2$ gas can be chosen from the range of 50 to 3000 mL/min (sccm), and more preferably from the range of 200 to 1500 mL/min (sccm), and the flow rate of the $Si_2H_6$ gas can be chosen from the range of 0.1 to 50 mL/min (sccm), and more preferably from the range of 0.5 to 5 mL/min (sccm), in such a manner as to achieve the above flow rate proportions.

[Fabrication of Small-Bandgap Film]

If it is desired to fabricate a silicon nitride film having a small bandgap (for example, a bandgap in the range of 2.5 eV to less than 5 eV), it is preferable to conduct the plasma CVD using the following conditions.

When using an ammonia/silane gas mixture, for example, an $NH_3$ gas as the nitrogen-containing gas and a $Si_2H_6$ gas as the silicon-containing gas, it is preferable to set the processing pressure in the range of 1 to 1333 Pa, and more preferably in the range of 1 to 133 Pa. In this case, the proportion of the flow rate of the $NH_3$ gas to the total gas flow rate is in the range of 10 to 99.99%, and more preferably in the range of 90 to 99.9%, and the proportion of the flow rate of the $Si_2H_6$ gas to the total gas flow rate is in the range of 0.001 to 10%, and more preferably in the range of 0.01 to 10%. At this time, from the standpoint of increasing the amount of charge trapping in the silicon nitride film, enhancing the write speed and erasing speed, and increasing the charge retention capability, the flow rate ratio between the $Si_2H_6$ gas and the $NH_3$ gas ($Si_2H_6$ gas flow rate/$NH_3$ gas flow rate) is preferably set in the range of 0.015 to 0.2. Further, the flow rate of the rare gas can be chosen from the range of 20 to 2000 mL/min (sccm), and more preferably from the range of 200 to 1000 mL/min (sccm), the flow rate of the $NH_3$ gas can be chosen from the range of 20 to 1000 mL/min (sccm), and more preferably from the range of 20 to 800 mL/min (sccm), and the flow rate of the $Si_2H_6$ gas can be chosen from the range of 0.5 to 50 mL/min (sccm), and more preferably from the range of 0.5 to 10 mL/min (sccm), in such a manner as to achieve the above flow rate proportions.

When using a nitrogen/silane gas mixture, for example, an $N_2$ gas as the nitrogen-containing gas and a $Si_2H_6$ gas as the silicon-containing gas, it is preferable to set the processing pressure in the range of 1 to 1333 Pa, and more preferably in the range of 1 to 133 Pa. In this case, the proportion of the flow rate of the $N_2$ gas to the total gas flow rate is in the range of 10 to 99.99%, and more preferably in the range of 90 to 99.9%, and the proportion of the flow rate of the $Si_2H_6$ gas to the total gas flow rate is in the range of 0.01 to 90%, and more preferably in the range of 0.1 to 10%. At this time, from the standpoint of increasing the amount of charge trapping in the silicon nitride film, enhancing the write speed and erasing speed, and increasing the charge retention capability, the flow rate ratio between the $Si_2H_6$ gas and the $N_2$ gas ($Si_2H_6$ gas flow rate/$N_2$ gas flow rate) is preferably set in the range of 0.01 to 0.2. Further, the flow rate of the rare gas can be chosen from the range of 20 to 3000 mL/min (sccm), and more preferably from the range of 200 to 1000 mL/min (sccm), the flow rate of the $N_2$ gas can be chosen from the range of 20 to 3000 mL/min (sccm), and more preferably from the range of 200 to 2000 mL/min (sccm), and the flow rate of the $Si_2H_6$ gas can be chosen from the range of 0.5 to 50 mL/min (sccm), and more preferably in the range of 0.5 to 10 mL/min (sccm), in such a manner as to achieve the above flow rate proportions.

In either case, the processing temperature of the plasma CVD should be set so that the susceptor 2 is heated at a temperature in the range of 300° C. to 800° C. or higher, and preferably in the range of 400° C. to 600° C.

If the plasma CVD is conducted by alternately using the processing conditions for increasing the bandgap and the processing conditions for reducing the bandgap, silicon nitride films having different bandgaps can be deposited alternately one on top of another. In particular, since the bandgap size can be easily controlled by varying only the processing pressure, it becomes possible to form a multilayer structure by successively depositing silicon nitride films having different bandgaps, which is highly advantageous in improving process efficiency.

Furthermore, since the bandgap of each silicon nitride film can be easily adjusted by simply adjusting the processing pressure, insulating film stack structures having various bandgap structures can be easily fabricated. Therefore, the invention can be advantageously applied to the process for fabricating a MOS semiconductor memory device that achieves excellent data retention characteristics while also achieving high-speed data write performance, low-power operation performance, and high reliability.

Next, the plasma CVD process will be further described by taking as an example the fabrication of the insulating film stack structure 102a of the MOS semiconductor memory device 601 according to the first embodiment of the present invention.

The MOS semiconductor memory device fabrication method performed by varying the pressure conditions will be described below by taking as an example the fabrication of the insulating film stack structure 102a for the MOS semiconductor memory device 601 (see FIG. 1). The description here is given by taking one example of a typical procedure. The process for forming the first and fifth insulating films 111 and 115 is the same as that described in the first embodiment, and will not be further described here.

The second, third, and fourth insulating films 112, 113, and 114 are sequentially deposited one on top of another on the first insulating film 111 by plasma CVD using the plasma processing apparatus 100. When depositing the second insulating film 112, the plasma CVD is conducted using the processing conditions for reducing the bandgap compared with that of the first insulating film 111. When depositing the third insulating film 113, the plasma CVD is conducted using the processing conditions for reducing the bandgap compared with that of the second insulating film 112. When depositing the fourth insulating film 114, the plasma CVD is conducted using the processing conditions for increasing the bandgap compared with that of the third insulating film 113. In the example shown in FIG. 1, the second and fourth insulating films 112 and 114 are deposited using the same plasma CVD conditions so that these two films have the same bandgap size. However, the bandgaps 112a and 114a of the second and fourth insulating films 112 and 114 may be made different. The bandgap size of each film can be easily controlled by varying only the pressure conditions in the plasma CVD while maintaining the flow rate of the silane-based gas constant, as earlier described.

The successive deposition of the insulating films by controlling the pressure as described above can also be applied to the fabrication of the MOS semiconductor memory device according to any one of the second to sixth embodiments.

Figure 17:
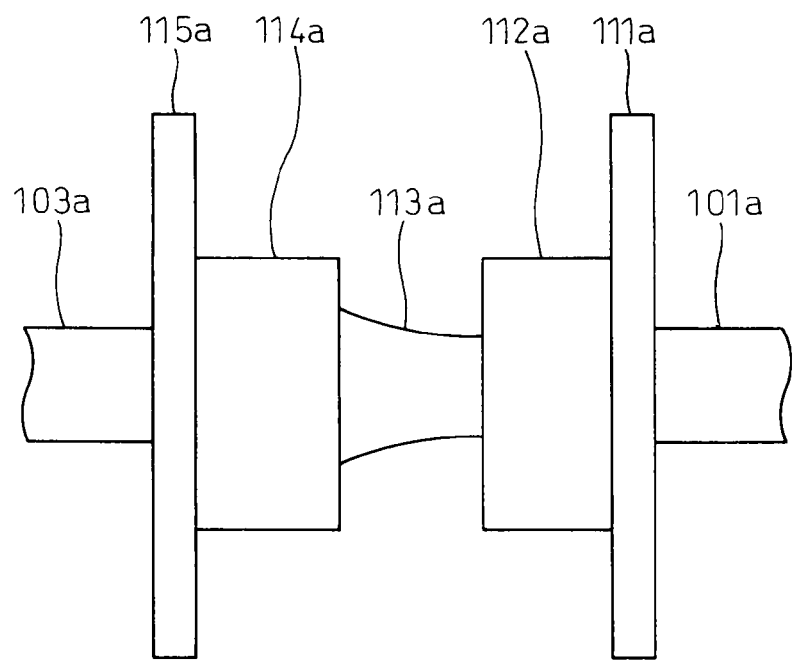
FIG. 17 is an energy band diagram showing a modified example of the MOS semiconductor memory device of FIG. 1.

When conducting the plasma CVD using the plasma processing apparatus 100, the plasma CVD processing pressure may be gradually changed during the formation of one insulating film. For example, in the process of fabricating the MOS semiconductor memory device 601 of the first embodiment shown in FIG. 1, if the third insulating film 113 is formed by increasing or reducing the processing pressure in small increments while maintaining the flow rate of the silane-based gas constant, for example, as shown in FIG. 15, or by gradually increasing or reducing the flow rate of the silane-based gas while maintaining the processing pressure constant, for example, as shown in FIG. 16, the MOS semiconductor memory device can be fabricated to have an energy band structure such as shown in FIG. 17. In this case, it is preferable that the silicon nitride film be deposited at the same thickness in each step of changing the processing pressure or in each step of changing the process gas flow rate. FIG. 17 shows an example in which the third insulating film 113 is formed by changing the processing pressure so that the bandgap 113a gradually increases. Conversely to the example shown in FIG. 17, it is also possible to form the third insulating film 113 in such a manner that the bandgap 113a gradually decreases.

[Configuration Example of Memory Cell Array]

Next, the configuration of a memory cell array forming a nonvolatile memory (flash memory) to which the MOS semiconductor memory device of the present invention can be applied will be described with reference to FIGS. 18 to 27. A memory cell array can be constructed by arranging in a matrix form a plurality of memory cells each identical to the MOS semiconductor memory device according to any one of the first to sixth embodiments. The structure of the memory cell array is not specifically limited, but any suitable type, for example, the NOR type or the NAND type, can be employed.

Figure 18:
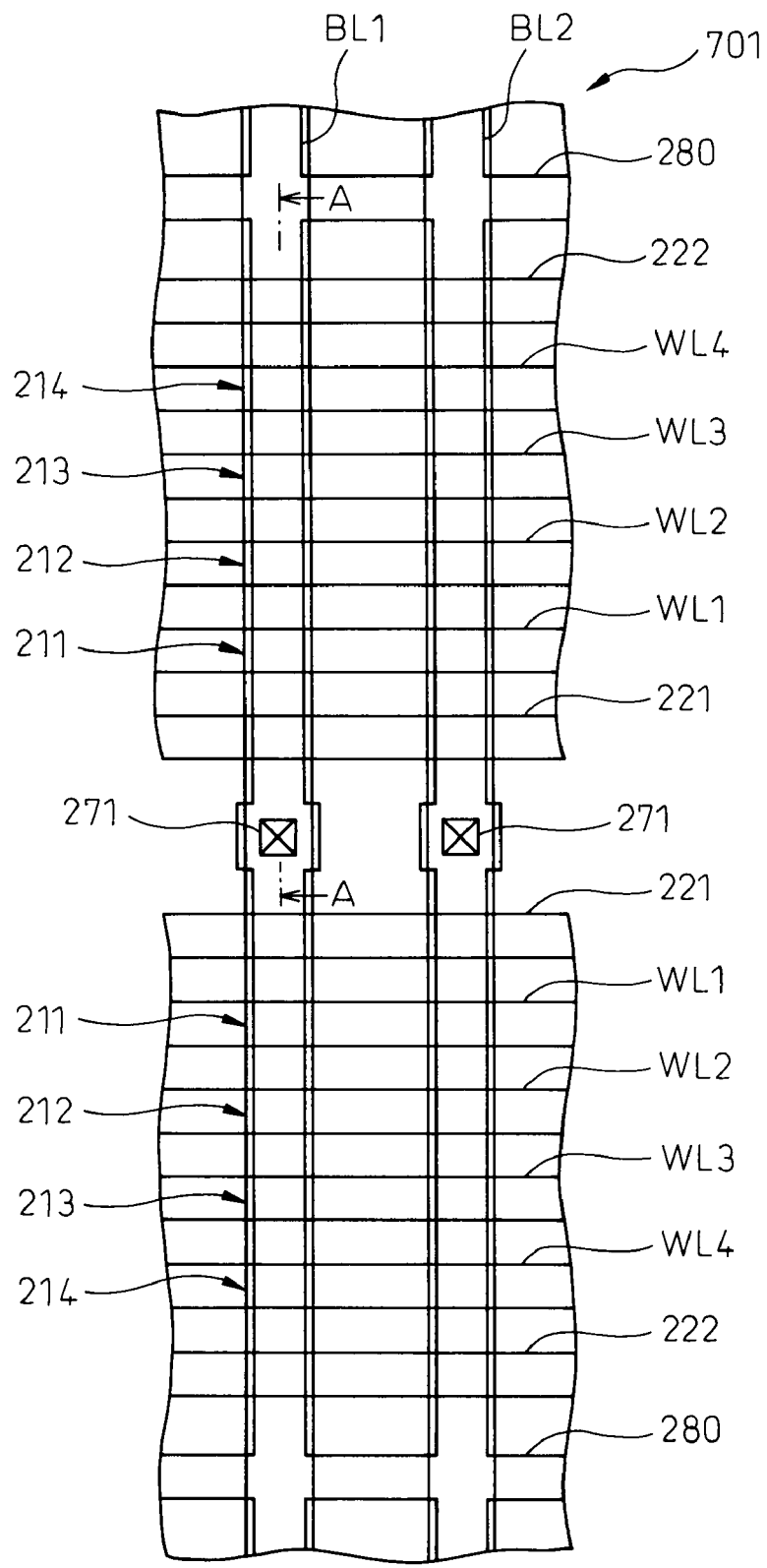
FIG. 18 is a plan view of a NAND memory cell array to which the MOS semiconductor memory device of the present invention can be applied.
Figure 19:
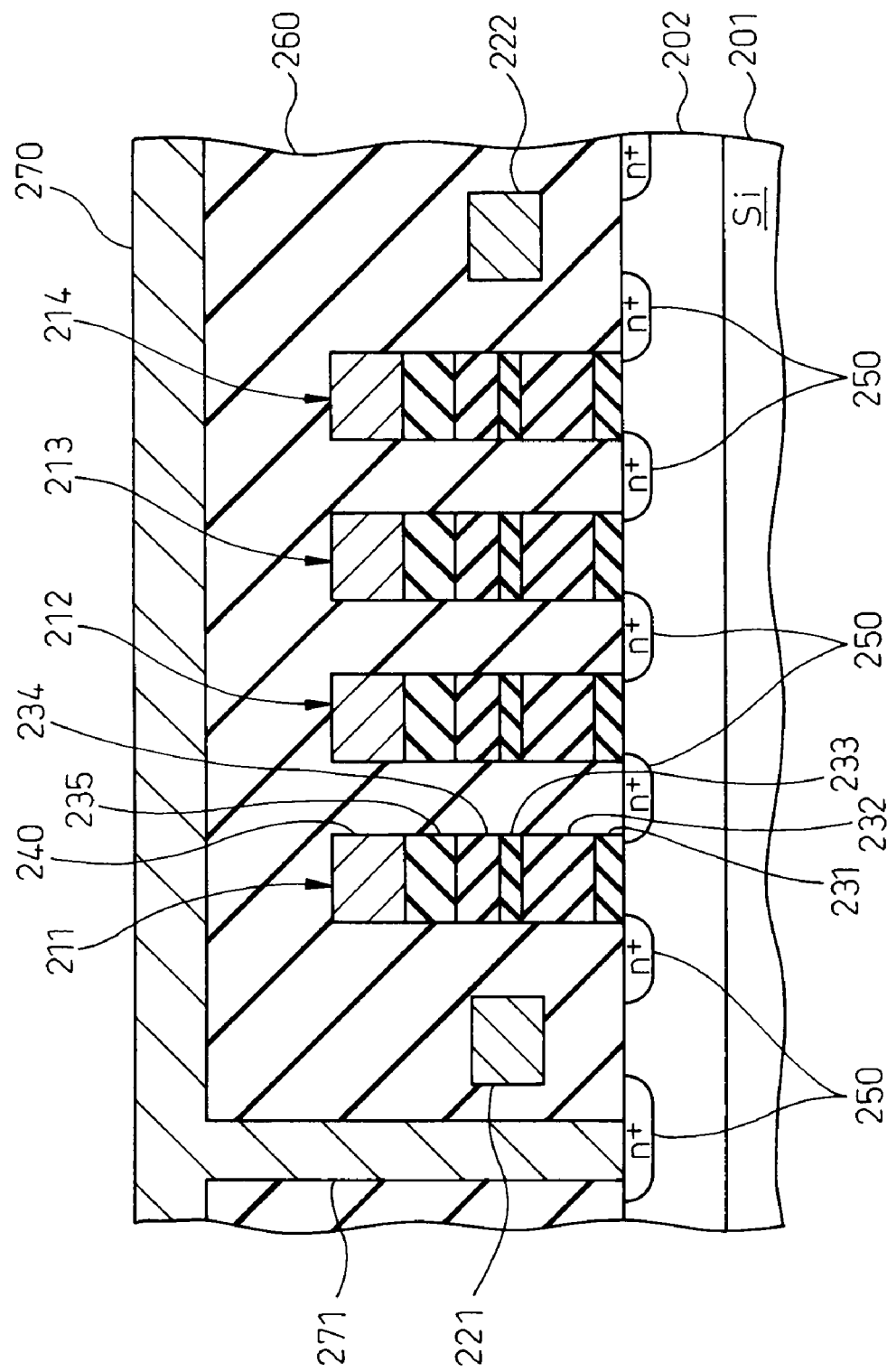
FIG. 19 is a cross-sectional view taken along line A-A in FIG. 18.
Figure 20:
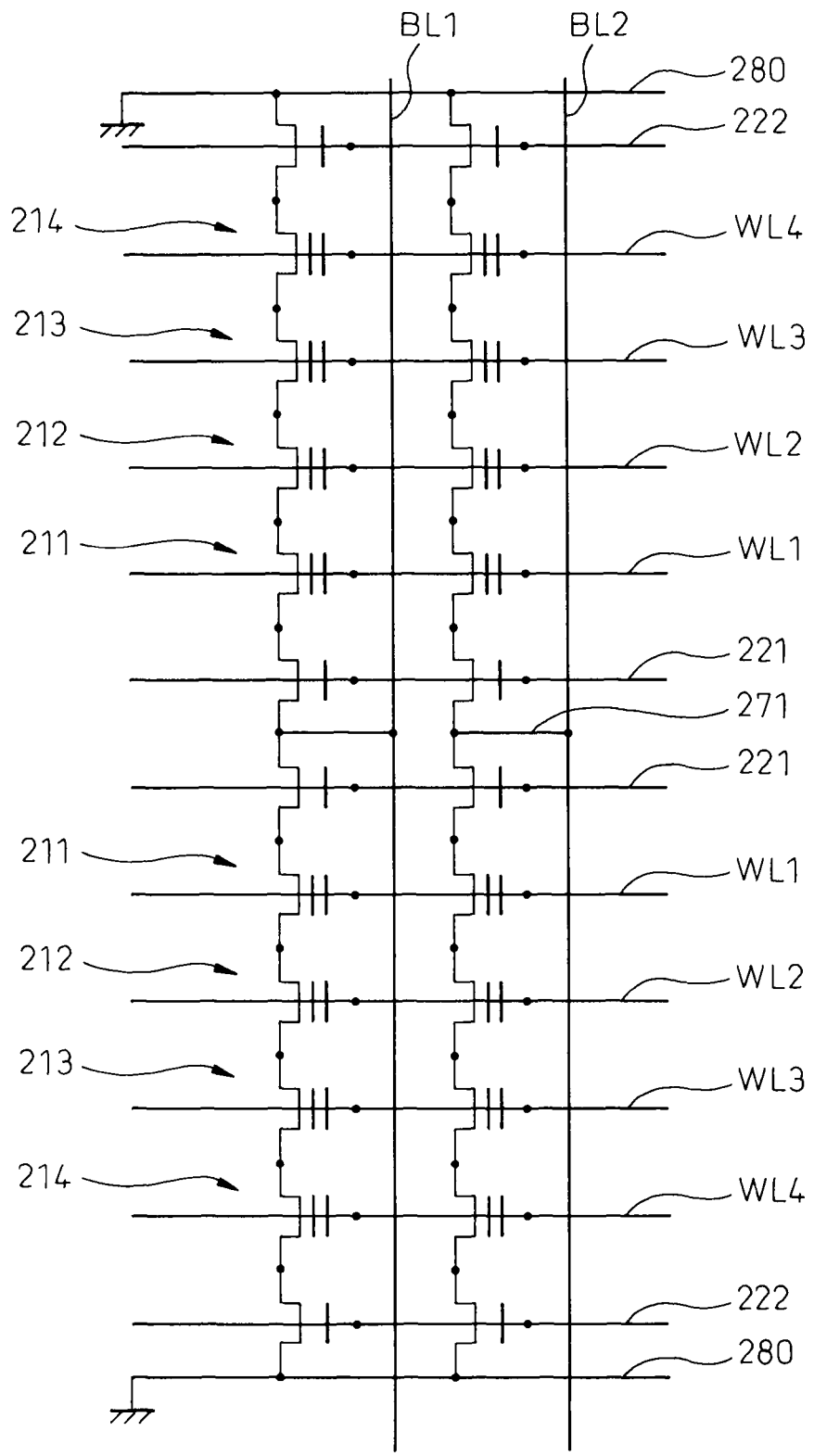
FIG. 20 is an equivalent circuit diagram of the memory cell array shown in FIG. 18.

FIG. 18 shows a configuration example of a NAND memory cell array 701 constructed by serially connecting memory cells each identical to the MOS semiconductor memory device according to any one of the embodiments of the present invention. FIG. 19 is a cross-sectional view taken along line A-A in FIG. 18. FIG. 20 is an equivalent circuit diagram of the memory cell array 701 shown in FIG. 18.

In the illustrated embodiment, four memory cells 211 to 214 are connected in series on each bit line BL1, BL2, ..., as shown in FIG. 18, with source and drain diffusion layers being shared between the respective adjacent memory cells. A large number of blocks, each comprising such serially memory cells, are interconnected to construct the NAND memory cell array 701.

As can be seen from the cross-sectional structure shown in FIG. 19, a p-well 202 is formed in an n-type silicon substrate 201, and the memory cells 211 to 214 are arranged in series on the p-well 202. A select gate electrode 221 is provided at one end of the array of the four memory cells 211 to 214, and a select gate electrode 222 is provided at the other end. Regions formed as n-type diffusion layers 250 in the p-well 202 serve as the sources and drains of the memory cells 211 to 214. The memory cells 211 to 214 may be formed on a p-type silicon substrate or a p-type silicon layer.

Each of the memory cells 211 to 214 includes a first insulating film 231 formed on the p-well 202, a second insulating film 232 formed on the first insulating film 231, a third insulating film 233 formed on the second insulating film 232, a fourth insulating film 234 formed on the third insulating film 233, a fifth insulating film 235 formed on the fourth insulating film 234, and a gate electrode 240 formed on the fifth insulating film 235.

The memory cells 211 to 214 are covered with an insulating film 260 deposited by CVD or like process, on top of which a metal interconnect line 270 of Al or the like is formed as the bit line (BL1, BL2, ... ). The interconnect line 270 is connected to the n-type diffusion layer 250 via a contact region 271.

The drain side at one end of the memory cell array 701 is connected to the bit line BL1, BL2, ..., via the select gate 221, and the source side at the other end is connected to a common source line (ground line) 280 via the select gate 222. The gate electrode 240 of each memory cell is connected to one of the word lines (WL1, WL2, WL3, and WL4) extending in a direction intersecting the bit lines BL1, BL2, ....

FIG. 19 has shown the stack structure comprising the first to fifth insulating films 231 to 235 and gate electrode 240, but the structure of each of the memory cells 211 to 214 may be made the same as that of any one of the MOS semiconductor memory devices 601 to 606 of the first to sixth embodiments. That is, the first to fifth insulating films 231 to 235 may be made the same as those in any one of the insulating film stack structures 102a to 102d employed in the MOS semiconductor memory devices 601 to 604 of the first to fourth embodiments, or a larger number of insulating films may be stacked as in the insulating film stack structure 102e employed in the MOS semiconductor memory device 605 of the fifth embodiment. Alternatively, a structure having gate electrodes on the top and bottom, as in the MOS semiconductor memory device 606 of the sixth embodiment, may also be employed in the illustrated embodiment.

In the illustrated embodiment, the memory cell array 701 is constructed by interconnecting a large number of blocks each comprising four memory cells. However, each unit block of the memory cell array 701 may be formed from a larger number of memory cells.

Figure 21:
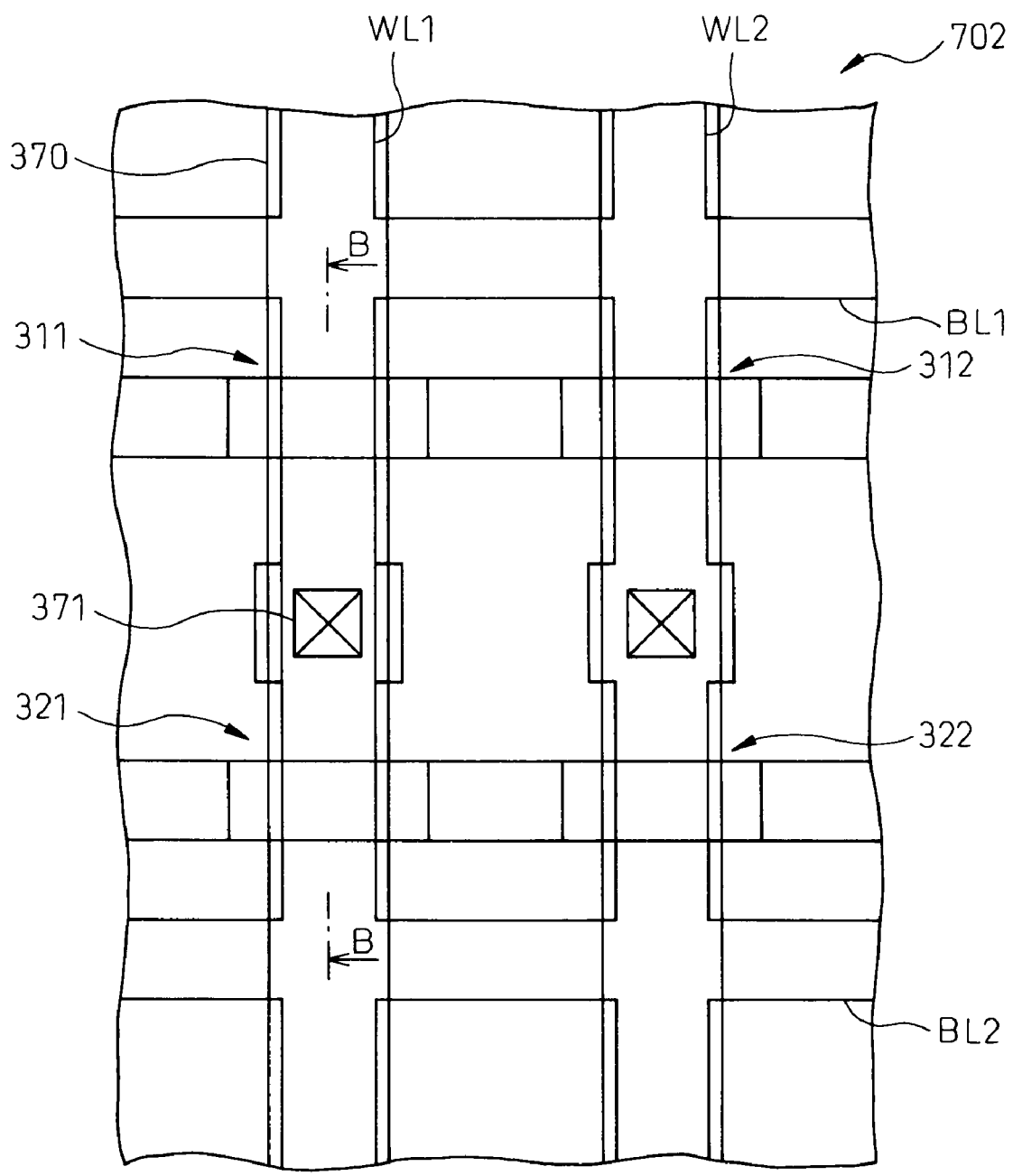
FIG. 21 is a plan view of a NOR memory cell array to which the MOS semiconductor memory device of the present invention can be applied.
Figure 22:
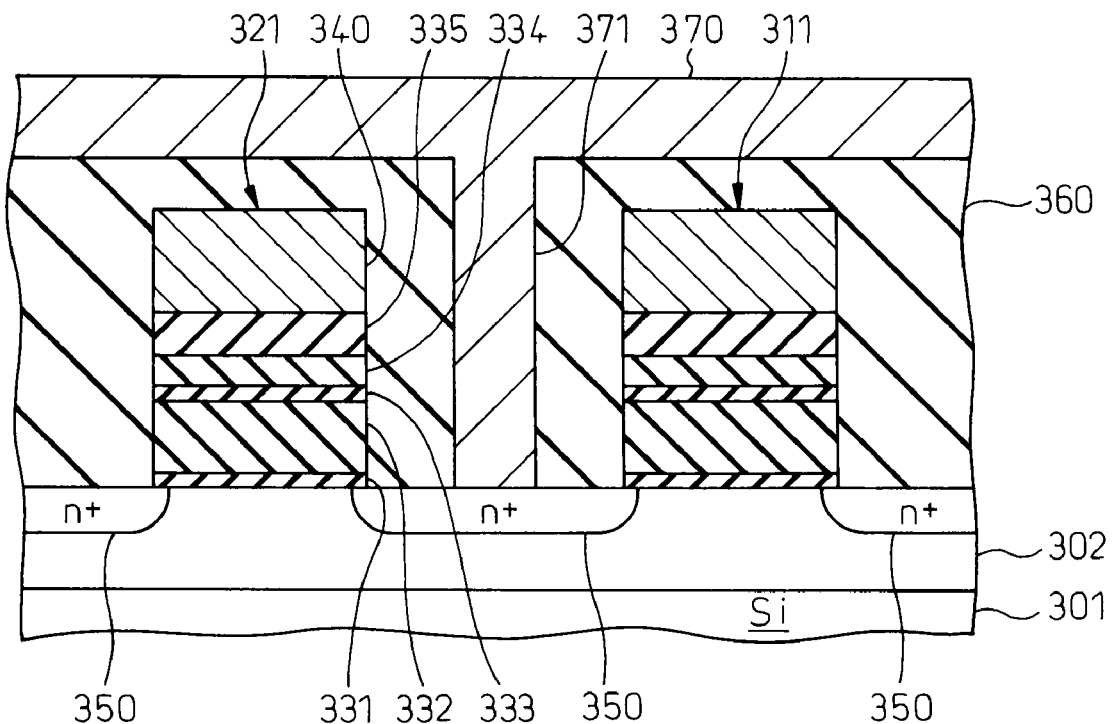
FIG. 22 is a cross-sectional view taken along line B-B in FIG. 21.
Figure 23:
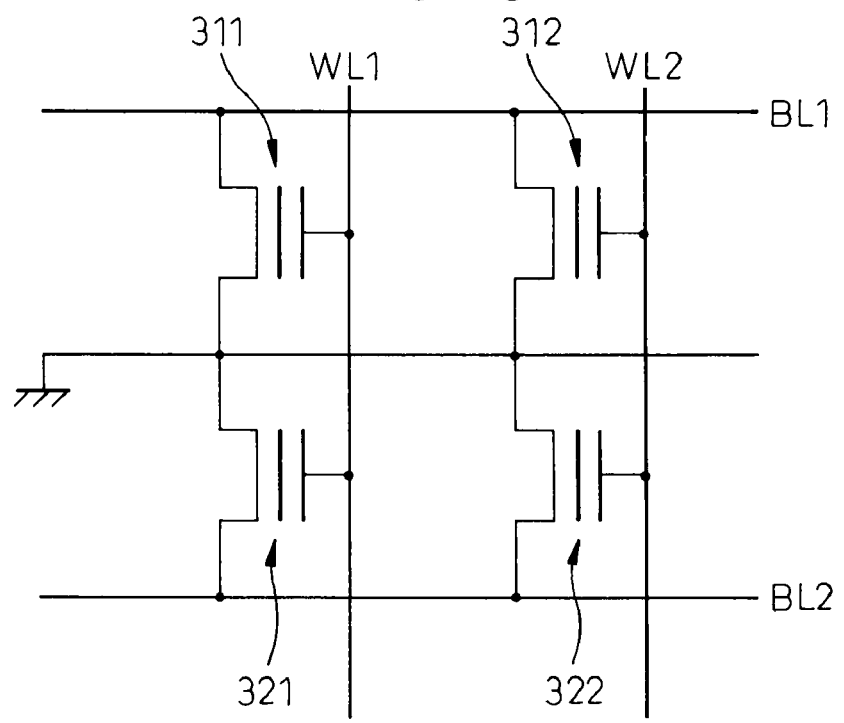
FIG. 23 is an equivalent circuit diagram of the memory cell array shown in FIG. 21.

FIGS. 21 to 23 show a configuration example of a NOR memory cell array constructed by parallelly connecting memory cells each identical to the MOS semiconductor memory device according to any one of the embodiments of the present invention. FIG. 21 is a plan view of the NOR memory cell array 702, and FIG. 22 is a cross-sectional view taken along line B-B in FIG. 21. FIG. 23 is an equivalent circuit diagram of the memory cell array 702 shown in FIG. 21.

In the illustrated embodiment, a large number of memory cells 311, 312, ..., 321, 322, ..., connected in parallel on the respective bit lines BL1, BL2, ..., are arranged in a matrix form to construct the NOR memory cell array 702.

As can be seen from the cross-sectional structure shown in FIG. 22, a p-well 302 is formed in an n-type silicon substrate 301, and the memory cells 311, 312, ..., 321, 322, ... are formed on the p-well 302. Each memory cell includes a first insulating film 331 formed on the p-well 302, a second insulating film 332 formed on the first insulating film 331, a third insulating film 333 formed on the second insulating film 332, a fourth insulating film 334 formed on the third insulating film 333, a fifth insulating film 335 formed on the fourth insulating film 334, and a gate electrode 340 formed on the fifth insulating film 335. Regions formed as n-type diffusion layers 350 in the p-well 302 serve as the sources and drains of the respective memory cells. The memory cells may be formed on a p-type silicon substrate or a p-type silicon layer.

Each memory cell is covered with an insulating film 360 deposited by CVD or like process, on top of which a metal interconnect line 370 of Al or the like is formed. The interconnect line 370 is connected to the n-type diffusion layer 350 via a contact region 371. The gate electrode 340 of each of the memory cells 311, 312, ..., 321, 322, ... is connected to one of the word lines WL1, WL2, ... extending in a direction intersecting the bit lines BL1, BL2, ....

FIG. 22 has shown the MOS memory structure comprising the first to fifth insulating films 331 to 335 and gate electrode 340 stacked one on top of another, but the structure of each of the memory cells 311, 312, ..., 321, 322, ... may be made the same as that of any one of the MOS semiconductor memory devices 601 to 606 of the first to sixth embodiments. That is, the first to fifth insulating films 331 to 335 may be made the same as those in any one of the insulating film stack structures 102a to 102d employed in the MOS semiconductor memory devices 601 to 604 of the first to fourth embodiments, or a larger number of insulating films may be stacked as in the insulating film stack structure 102e employed in the MOS semiconductor memory device 605 of the fifth embodiment. Alternatively, a structure having gate electrodes on top and bottom, as in the MOS semiconductor memory device 606 of the sixth embodiment, may also be employed in the illustrated embodiment.

[Configuration Example of Vertical Memory Cell]

Figure 24:
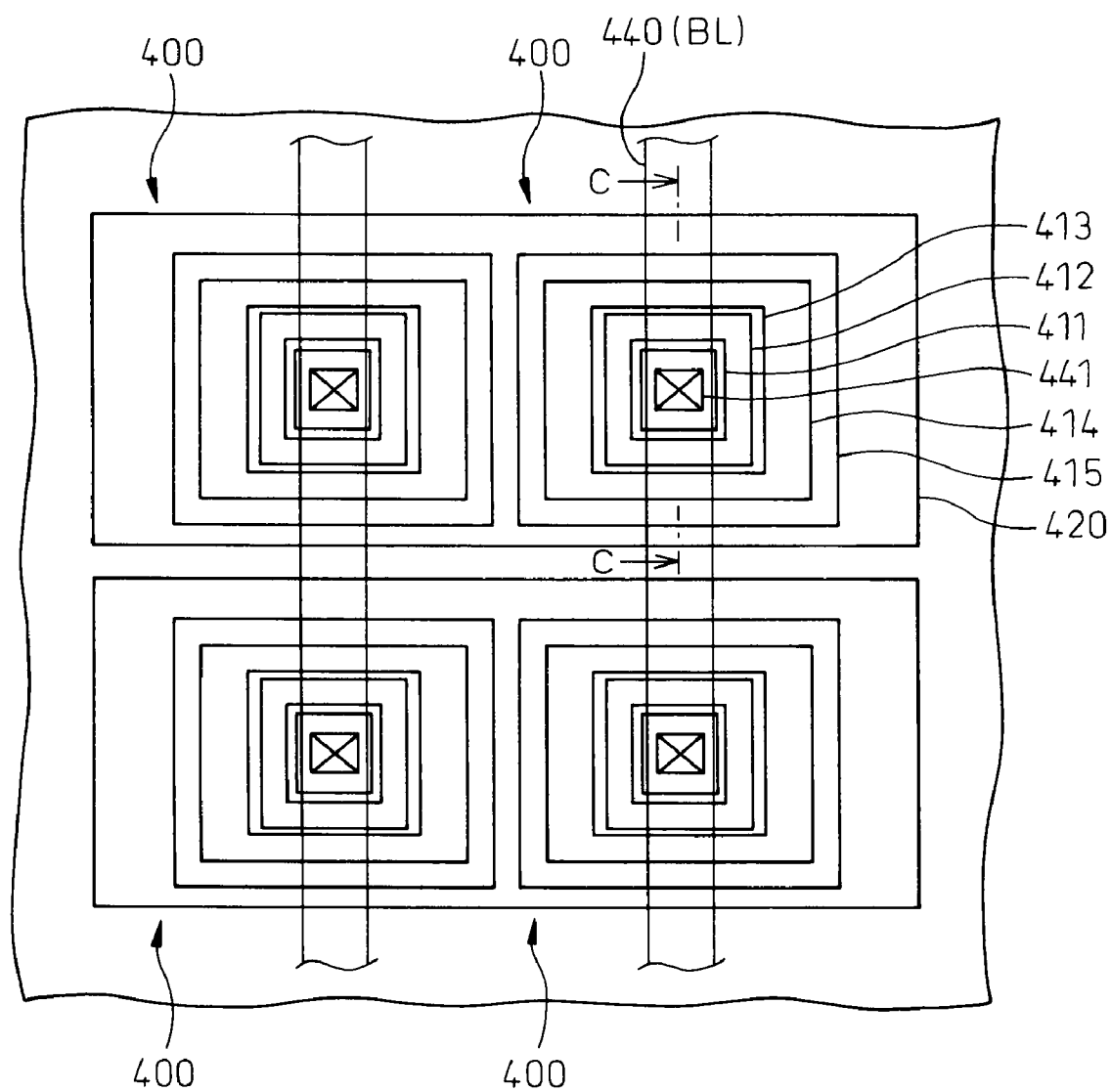
FIG. 24 is a plan view of a vertical memory cell array to which the MOS semiconductor memory device of the present invention can be applied.
Figure 25:
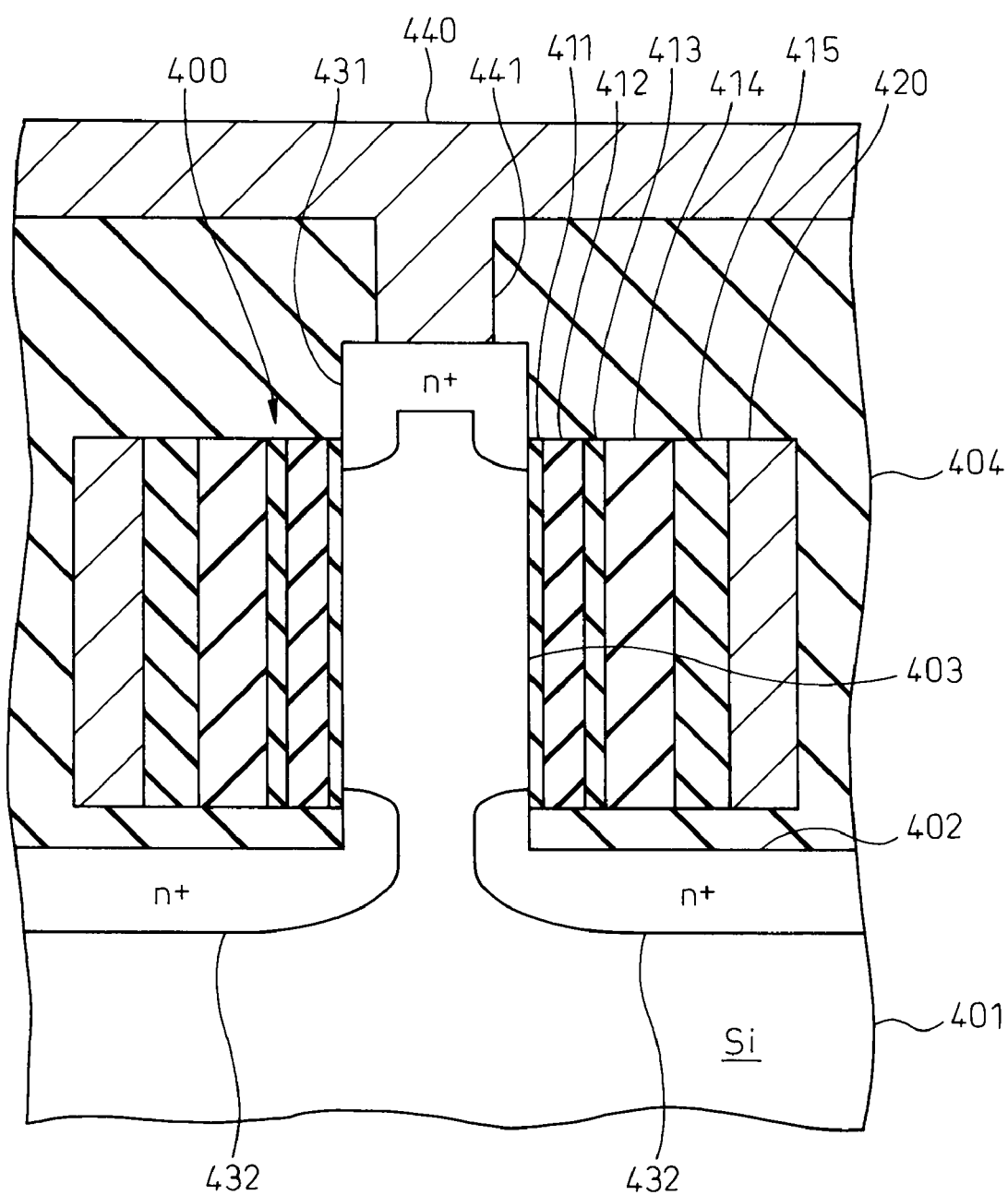
FIG. 25 is a cross-sectional view taken along line C-C in FIG. 24.

A semiconductor memory cell of a vertical structure can be constructed using the MOS semiconductor memory device of the present invention. FIG. 24 is a plan view of vertical memory cells, and FIG. 25 is a cross-sectional view taken along line C-C in FIG. 24. In FIG. 24, four vertical memory cells 400 are shown.

The illustrated embodiment uses a silicon substrate 401 of a first conductivity type (for example, p-type). The silicon substrate 401A includes a plurality of silicon pillars 403 which are separated by groove 402 formed in a grid pattern. Each vertical memory cell 400 is formed centered around one of the silicon pillars 403. That is, a first insulating film 411, a second insulating film 412, a third insulating film 413, a fourth insulating film 414, and a fifth insulating film 415 are formed in this order so as to encircle the p-type silicon pillar 403, and a gate electrode 420 is formed on the outside of the thus formed structure. An insulating film 404 of a prescribed thickness is formed in the grooves 402 in such a manner as to cover each vertical memory cell 400. The silicon pillars 403 may be formed on a p-well or a p-type silicon layer formed in the semiconductor substrate.

On the top of each p-type silicon pillar 403 is formed a drain 431 as an n-type diffusion layer of a second conductivity type. Further, an n-type diffusion layer as a source 432 is formed underneath the p-type silicon pillar 403. The vertical memory cell 400 thus has a MOSFET structure.

In the illustrated embodiment, the gate electrode 420 is connected to a word line not shown. The vertical memory cell 400 is covered with the insulating film 404, on which a metal interconnect line 440 of Al or the like is formed as a bit line BL to which the drains 431 of other memory cells are also connected. The metal interconnect line 440 extends in a direction intersecting the word line (not shown) and is connected to the drain 431 via a contact region 441.

In the vertical memory cell 400 of the illustrated embodiment, data writing is performed by applying a positive voltage to the gate electrode 420 via the selected word line not shown and 0 V to the selected bit line and thereby injecting electrons from the silicon pillar 403 of the silicon substrate 401 into the insulating film stack structure of the selected vertical memory cell 400 by utilizing the tunnel effect. Since the threshold voltage of the vertical memory cell 400 changes when data has been written to it, data reading can be performed by applying a prescribed read voltage to the word line and detecting the presence or absence of data ("0" or "1") based on whether or not a current flows through the vertical memory cell.

In each vertical memory cell 400 of the illustrated embodiment, the first to fifth insulating films 411 to 415 and the gate electrode 420 may be formed so as to fully encircle the side wall of the silicon pillar 403 or so as to partially encircle the side wall of the silicon pillar 403.

Further, the insulating film stack structure (the first to fifth insulating films 411 to 415) which acts as the charge storing region in the illustrated embodiment may be implemented, for example, by horizontally arranging any one of the insulating film stack structures 102a to 102d employed in the MOS semiconductor memory devices 601 to 604 of the first to fourth embodiments, or by horizontally arranging the insulating film stack structure 102e having a larger number of insulating films as in the MOS semiconductor memory device 605 of the fifth embodiment. In the illustrated embodiment also, two gate electrodes may be provided, as in the MOS semiconductor memory device 606 of the sixth embodiment, and the stack structure may be implemented by stacking the gate electrodes and the insulating films in the horizontal direction.

[Configuration Example of Stacked Memory Cell Array]

A stacked memory cell array can be constructed by vertically stacking on a semiconductor substrate a plurality of semiconductor memory cells each of a vertical structure and identical in configuration to the MOS semiconductor memory device of the present invention.

Figure 26:
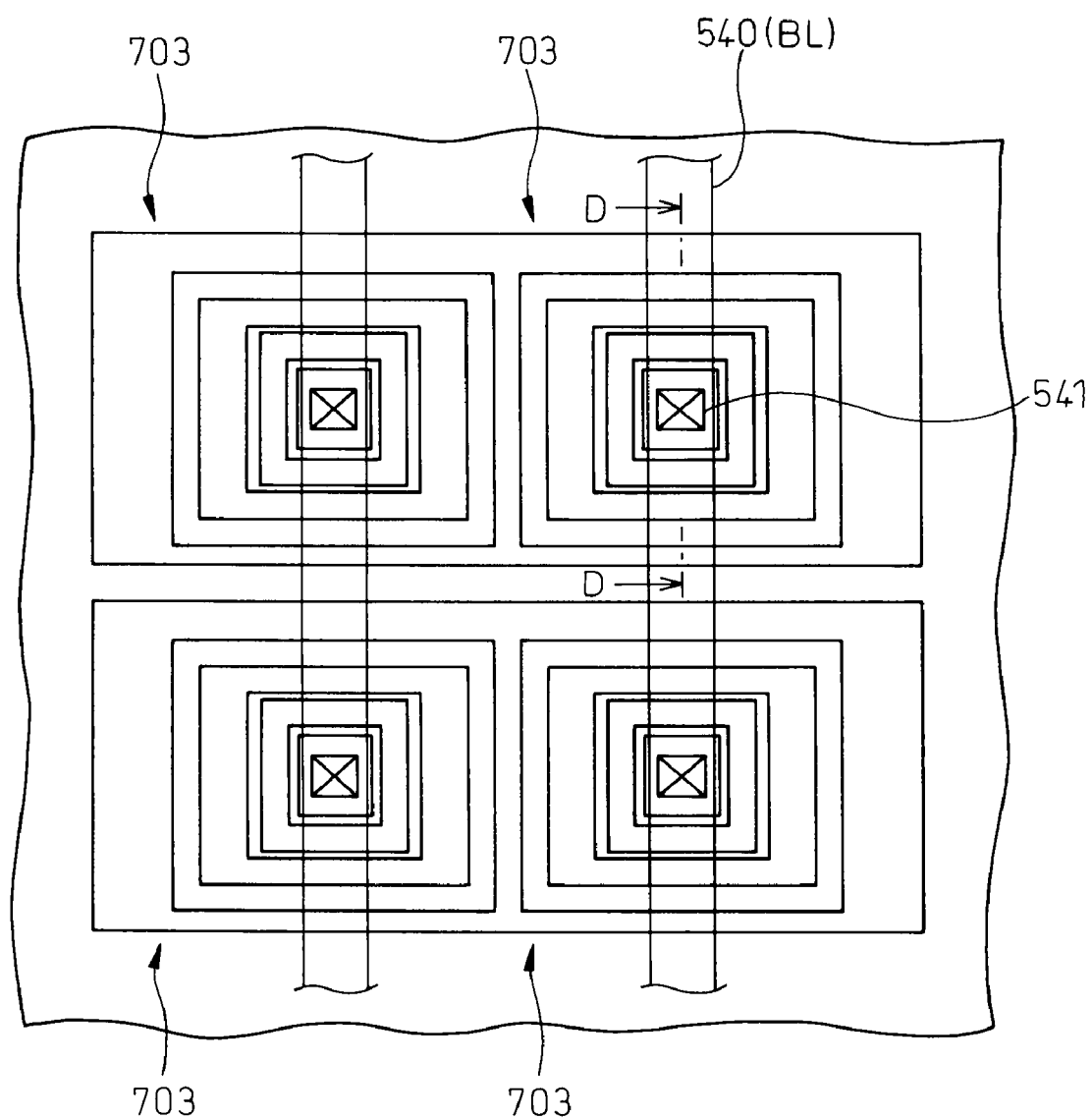
FIG. 26 is a plan view of stacked memory cell arrays to which the MOS semiconductor memory device of the present invention can be applied.
Figure 27:
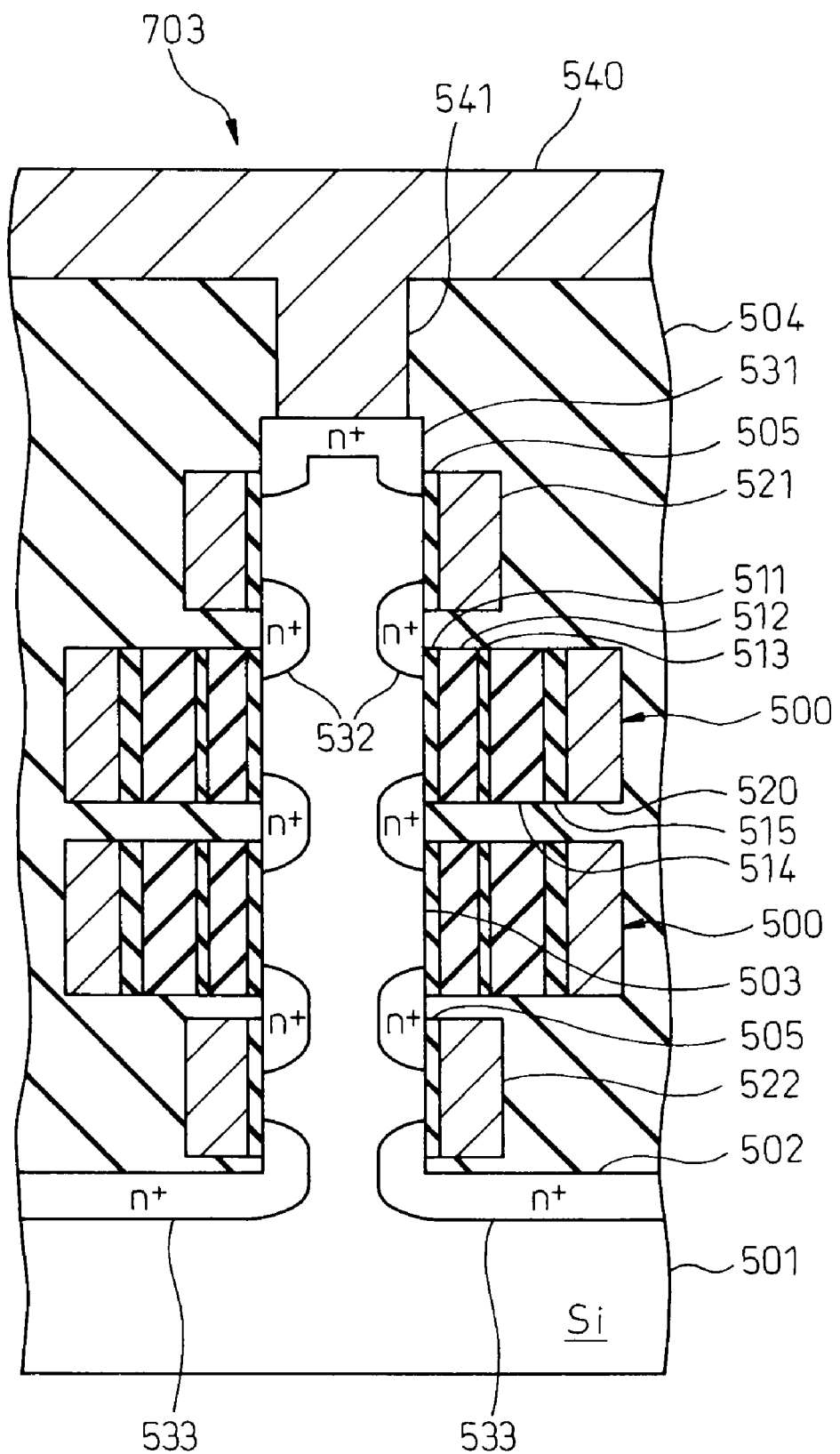
FIG. 27 is a cross-sectional view taken along line D-D in FIG. 26.

FIG. 26 is a plan view of stacked memory cell arrays 703 each constructed by stacking vertical memory cells, and FIG. 27 is a cross-sectional view taken along D-D in FIG. 26. In FIG. 26, four stacked memory cell arrays 703 are shown.

As shown in FIG. 27, the stacked memory cell arrays 703 according to the illustrated embodiment use a silicon substrate 501 of a first conductivity type (for example, p-type). The silicon substrate 501A includes a plurality of silicon pillars 503 separated by grooves 502 formed in a grid pattern, and each stacked memory cell array 703 is formed around one of the silicon pillars 503 by arranging a plurality of stages of vertical memory cells 500 (only two stages are shown in FIG. 27) in a vertical direction. In the grooves 502 formed in the silicon substrate 501, an insulating film 504 of a prescribed thickness is formed in such a manner as to cover the vertical memory cells 500. Here, the silicon pillars 503 may be formed on a p-well or a p-type silicon layer formed in the semiconductor substrate.

Each vertical memory cell 500 is formed in such a manner as to encircle the silicon pillar 503. That is, each vertical memory cell 500 has a stack structure comprising a first insulating film 511, a second insulating film 512, a third insulating film 513, a fourth insulating film 514, and a fifth insulating film 515 formed in this order on the side wall of the silicon pillar 503 and a gate electrode 520 formed on the outside of the thus formed structure. Select gates 521 and 522 are formed, each by interposing an insulating film 505, on the upper and lower portions of the silicon pillar 503. On the top of the silicon pillar 503 is formed an n-type diffusion layer 531 of a second conductivity type that serves as a drain. Further, a plurality of n-type diffusion layers 532, serving as sources and drains for connecting the adjacent vertical memory cells 500, are formed in the side wall of the silicon pillar 503. Furthermore, an n-type diffusion layer 533 as a source common to the respective vertical memory cells 500 is formed underneath the silicon pillar 503. Each vertical memory cell 500 thus has a MOSFET structure. In a modified example of the illustrated embodiment, the n-type diffusion layers 532 may be omitted.

As described above, each stacked memory cell array 703 according to the illustrated embodiment has a structure in which the plurality of vertical memory cells 500 are connected in series in the vertical direction by one of the silicon pillars 503 formed on the silicon substrate 501. The gate electrodes 520 of the vertical memory cells 500 are connected together in the row direction to form a word line (not shown). Further, a metal interconnect line 540 of Al or the like, which serves as a bit line BL to which the drains 531 of the vertical memory cells 500 are connected in common, is formed on the insulating film 504 that covers the vertical memory cells 500. The metal interconnect line 540 extends in a direction intersecting the word line and is connected to the drain 531 via a contact region 541. The drain side is connected to the bit line BL via the select gate 521, and the source side is connected to the common source line (n-type diffusion layer 533) via the select gate 522. The equivalent circuit diagram of this stacked memory cell array 703 is the same as that of the NAND memory cell array shown in FIG. 18.

In each vertical memory cell 500, the first to fifth insulating films 511 to 515 and the gate electrode 520 may be formed so as to fully encircle the side wall of the silicon pillar 503 or so as to partially encircle the side wall of the silicon pillar 503.

Further, the insulating film stack structure (the first to fifth insulating films 511 to 515) which acts as the charge storing region in each vertical memory cell 500 may be implemented, for example, by horizontally arranging any one of the insulating film stack structures 102a to 102d employed in the MOS semiconductor memory devices 601 to 604 of the first to fourth embodiments, or by horizontally arranging the insulating film stack structure 102e having a larger number of insulating films as in the MOS semiconductor memory device 605 of the fifth embodiment. In the illustrated embodiment also, two gate electrodes may be provided, as in the MOS semiconductor memory device 606 of the sixth embodiment, and the stack structure may be implemented by stacking the gate electrodes and the insulating films in the horizontal direction.

While various embodiments of the present invention have been described above, the present invention is not limited to any specific embodiment described above, but various modifications can be made. For example, each of the above embodiments has been described by taking an n-channel MOS semiconductor memory device as an example, but in the case of a p-channel semiconductor memory device, each embodiment can be implemented by reversing the dopant conductivity.

DESCRIPTION OF REFERENCE NUMERALS

1 ... CHAMBER (PROCESSING CHAMBER)
2 ... SUSCEPTOR
3 ... SUPPORTING MEMBER
5 ... HEATER
12 ... EXHAUST PIPE
14, 15 ... ANNULAR GAS INLET MEMBER
16 ... LOAD/UNLOAD OPENING
17 ... GATE VALVE
18 ... GAS SUPPLY MECHANISM
19a ... N-CONTAINING GAS SUPPLY SOURCE
19b ... Si-CONTAINING GAS SUPPLY SOURCE
19c ... INERT GAS SUPPLY SOURCE
24 ... EXHAUST DEVICE
27 ... MICROWAVE INTRODUCING MECHANISM
28 ... TRANSMISSION PLATE
31 ... PLANAR ANTENNA MEMBER
32 ... MICROWAVE RADIATING HOLES
37 ... WAVEGUIDE
39 ... MICROWAVE GENERATOR
50 ... CONTROL UNIT
100 ... PLASMA PROCESSING UNIT
101 ... SILICON SUBSTRATE
102a, 102b, 102c, 102d, 102e, 102f ... INSULATING FILM STACK STRUCTURE
103 ... GATE ELECTRODE
104 ... FIRST SOURCE/DRAIN
105 ... SECOND SOURCE/DRAIN
111 ... FIRST INSULATING FILM
112 ... SECOND INSULATING FILM
113 ... THIRD INSULATING FILM
114 ... FOURTH INSULATING FILM
601, 602, 603, 604, 605, 606 ... MOS SEMICONDUCTOR MEMORY DEVICE
W ... SEMICONDUCTOR WAFER (W)

What is claimed is:

1. A MOS semiconductor memory device which includes, between a semiconductor layer and a gate electrode, an insulating film stack structure as a charge storing region that is constructed by stacking a plurality of insulating films one on top of another,
   wherein said insulating film stack structure includes a first insulating film formed closest to said semiconductor layer, a second insulating film formed closest to said gate electrode, and at least a third, fourth and fifth insulating films interposed between said first and second insulating films, wherein each of said first and second insulating films has a larger bandgap than said third, fourth and fifth insulating films and said fourth insulating film has a larger bandgap than said third and fifth insulating films.

2. A MOS semiconductor memory device as claimed in claim 1, wherein said insulating film stack structure is constructed by repeatedly forming, between said first and said second insulating film, an intermediate stack structure comprising said third, fourth, and fifth insulating films.

3. A MOS semiconductor memory device as claimed in claim 1, wherein said first insulating film is formed in contact with said semiconductor layer.

4. A MOS semiconductor memory device as claimed in claim 1, wherein said insulating film stack structure is formed on said semiconductor layer by interposing therebetween a sixth insulating film formed on said semiconductor layer and a second gate electrode formed on said sixth insulating film.

5. A MOS semiconductor memory device as claimed in claim 1, wherein said first and second insulating films are each a silicon oxide film, and said third, fourth, and fifth insulating films are each a silicon nitride film, a silicon nitride-oxide film, or a metal oxide film.

6. A MOS semiconductor memory device as claimed in claim 1, wherein said fourth insulating film has an energy band structure such that, when viewed in a film thickness direction moving away from said semiconductor layer and toward said gate electrode, the bandgap of said fourth insulating film is small at or near an interface with said third insulating film and at or near an interface with said fifth insulating film and increases toward the center of said fourth insulating film.

7. A MOS semiconductor memory device as claimed in claim 6, wherein said fourth insulating film is a silicon nitride-oxide film and has an oxygen concentration profile such that, when viewed in the film thickness direction moving away from said semiconductor layer and toward said gate electrode, the proportion of oxygen to nitrogen in said fourth insulating film is small at or near the interface with said third insulating film and at or near the interface with said fifth insulating film and increases toward the center of said fourth insulating film.

8. A MOS semiconductor memory device as claimed in claim 1, wherein said fourth insulating film has an energy band structure such that, when viewed in a film thickness direction moving away from said semiconductor layer and toward said gate electrode, the bandgap of said fourth insulating film is large at or near an interface with said third insulating film and at or near an interface with said fifth insulating film and decreases toward the center of said fourth insulating film.

9. A MOS semiconductor memory device as claimed in claim 8, wherein said fourth insulating film is a silicon nitride film and has a nitrogen concentration profile such that, when viewed in the film thickness direction moving away from said semiconductor layer and toward said gate electrode, the proportion of nitrogen to silicon in said fourth insulating film is small at or near the interface with said third insulating film and at or near the interface with said fifth insulating film and increases toward the center of said fourth insulating film.

10. A MOS semiconductor memory device as claimed in claim 1, wherein said third and said fifth insulating film each have a thickness smaller than the thickness of said fourth insulating film.

11. A MOS semiconductor memory device as claimed in claim 1, wherein said first and said second insulating film each have a thickness not smaller than 0.5 nm but not larger than 20 nm.

12. A MOS semiconductor memory device as claimed in claim 1, wherein electron potential energy in a conduction band of said semiconductor layer is higher than electron potential energy in a conduction band of said third insulating film at the time of data writing but is lower at the time of data reading as well as during data retention.

13. A MOS semiconductor memory device as claimed in claim 1, wherein said semiconductor layer is a pillar-like silicon layer, and a vertical stack structure comprising said insulating film stack structure and said gate electrode is disposed laterally to said pillar-like silicon layer.

14. A MOS semiconductor memory device as claimed in claim 1, wherein said fourth insulating film has an energy band structure such that the energy bandgap of said fourth insulating film increases in a film thickness direction moving away from said semiconductor layer and toward said gate electrode.

15. A NAND memory cell array comprising:
a plurality of memory cells arranged in series, each memory cell being constructed from a MOS semiconductor memory device,
wherein said MOS semiconductor memory device includes, between a semiconductor layer and a gate electrode, an insulating film stack structure as a charge storing region that is constructed by stacking a plurality of insulating films one on top of another,
said insulating film stack structure including a first insulating film formed closest to said semiconductor layer, a second insulating film formed closest to said gate electrode and at least third, fourth and fifth insulating films interposed between said first and second insulating films, and each of said first and second insulating films having a larger bandgap than said third, fourth and fifth insulating films, and said fourth insulating film having a larger bandgap than said third and fifth insulating films.

16. A NOR memory cell array comprising:
a plurality of memory cells arranged in parallel, each memory cell being constructed from a MOS semiconductor memory device,
wherein said MOS semiconductor memory device includes, between a semiconductor layer and a gate electrode, an insulating film stack structure as a charge storing region that is constructed by stacking a plurality of insulating films one on top of another,
said insulating film stack structure including a first insulating film formed closest to said semiconductor layer, a second insulating film formed closest to said gate electrode, and at least third fourth and fifth insulating films interposed between said first and second insulating films, and each of said first and second insulating films having a larger bandgap than said third, fourth and fifth insulating films, and said fourth insulating film having a larger bandgap than said third and fifth insulating films.

17. A MOS semiconductor memory device which includes, between a semiconductor layer and a gate electrode, an insulating film stack structure as a charge storing region that is constructed by stacking a plurality of insulating films one on top of another,
wherein said insulating film stack structure includes a first insulating film formed closest to said semiconductor layer, a second insulating film formed closest to said gate electrode, and at least a third, fourth and fifth insulating films interposed between said first and second insulating films,
wherein each of said first and second insulating films has a larger bandgap than said third, fourth and fifth insulating films and said fourth insulating film has a smaller bandgap than said third and fifth insulating films, and
wherein said insulating film stack structure is constructed by repeatedly forming, between said first and said second insulating film, an intermediate stack structure comprising said third, fourth, and fifth insulating films.

18. A MOS semiconductor memory device as claimed in claim 17, wherein said fourth insulating film has an energy band structure such that the energy bandgap of said fourth insulating film increases in a film thickness direction moving away from said semiconductor layer and toward said gate electrode.

19. A MOS semiconductor memory device which includes, between a semiconductor layer and a gate electrode, an insulating film stack structure as a charge storing region that is constructed by stacking a plurality of insulating films one on top of another,
wherein said insulating film stack structure includes a first insulating film formed closest to said semiconductor layer, a second insulating film formed closest to said gate electrode, and at least two insulating films interposed between said first and second insulating films, and each of said first and second insulating films has a larger bandgap than said at least two insulating films, and
wherein said semiconductor layer is a pillar-like silicon layer, and a vertical stack structure comprising said insulating film stack structure and said gate electrode is disposed laterally to said pillar-like silicon layer.

* * * * *